(12) United States Patent
Jacobsen et al.

(10) Patent No.: US 6,993,438 B2
(45) Date of Patent: Jan. 31, 2006

(54) SYSTEM AND METHOD FOR MEASURING ESSENTIAL POWER AMPLIFICATION FUNCTIONS

(75) Inventors: Robert E. Jacobsen, Los Altos, CA (US); Murthy S. Upmaka, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/088,965

(22) Filed: Mar. 24, 2005

(65) Prior Publication Data

US 2005/0171719 A1    Aug. 4, 2005

Related U.S. Application Data

(63) Continuation of application No. 10/194,192, filed on Jul. 12, 2002, now Pat. No. 6,895,343.

(51) Int. Cl.
*G01R 27/04*    (2006.01)

(52) U.S. Cl. .................... 702/57; 702/117; 702/124; 324/642

(58) Field of Classification Search ............ 702/57–59, 702/198, 64–71, 73–76, 106, 107, 85, 117, 702/118, 124, 126, 189, 194; 324/638, 637, 324/645, 646, 650, 642, 533–535, 601, 612, 324/613, 605, 76.53, 763, 765, 615, 616, 324/619; 330/84, 124 R, 126
See application file for complete search history.

(56) References Cited

U.S. PATENT DOCUMENTS

| | | | |
|---|---|---|---|
| 6,356,852 B1 * | 3/2002 | Ke | .............................. 702/117 |
| 6,529,844 B1 * | 3/2003 | Kapetanic et al. | ............. 702/85 |
| 6,636,816 B1 * | 10/2003 | Dvorak et al. | ................. 702/66 |
| 6,714,898 B1 * | 3/2004 | Kapetanic et al. | ........... 702/191 |

\* cited by examiner

*Primary Examiner*—Hal Wachsman

(57) ABSTRACT

An apparatus includes a device under test, a network analyzer, an internal amplifier, a first switch, a second switch, a third switch, a first air-line directional coupler, and a first attenuator. A method of characterization measurement includes providing a harmonics signal from the device under test to a spectrum analyzer, providing a generated signal and a reflected signal to a first receiver disposed within a network analyzer, and recording a parameter deviation of the network analyzer.

13 Claims, 26 Drawing Sheets

SYSTEM AND METHOD FOR MEASURING ESSENTIAL POWER AMPLIFICATION FUNCTIONS

CROSS REFERENCE TO RELATED APPLICATION(S)

This is a Continuation of application Ser. No. 10/194,192, filed on Jul. 12, 2002, now U.S. Pat. No. 6,895,343, issued May 17, 2005, the entire disclosure of which is incorporated herein by reference.

BACKGROUND

Various measurements need to be taken on a completed power amplifier (PA) to fully characterize the PA and determine that the PA is suitable for service. Those measurements include: input and output power; hot s-parameters (S11, S21, S22); adjacent channel power ratio (ACLR); spectrum emission masks (SEM); error vector magnitude (EVM); and harmonics and spurious measurements (up to about the $5^{th}$ or $6^{th}$ harmonic). In addition, the following measurements need to be taken on low power devices under test (DUTs) that makeup part of a PA (power amplifiers, filters, attenuators, and the like): normal (small-signal) s-parameters (s11, s21, s22) and input and output power.

Previous methods of performing the above tests have required either separate setups, where the DUT is connected to first one measuring instrument and then the other, or setups where the DUT is switched between setups, requiring a high-power RF switch at its output. This switch can be a source of unreliability due to the degradation of internal switch contacts when high RF power is run through them and especially in the case where the RF power is switched without momentarily turning it off ("hot switching").

One previous method found in the Anritsu "PATS" test set has two inherent disadvantages. One disadvantage is that high cost directional couplers at the output of the DUT must pass harmonics up to 13 GHz on its coupled port while handling high power on its through line. Another disadvantage is that the small-signal s22 and "hot" S22 measurements are less accurate because the power level from network analyzer source that probes the DUT output is approximately plus 5 dBm (or about 45 dB below the DUT output signal). When reduced by a DUT return loss of perhaps 20 dB the return signal is now 65 dB below the DUT carrier output and is difficult to select and measure accurately. The problem is aggravated when testing a DUT with a very good return loss of more than 20 dB.

Another prior method found in a Japan Radio Corporation (J RC) proposal for a high-power amplifier tester uses a "N by 2" switch matrix to multiplex N DUTs into two measuring ports. One port is connected to a vector network analyzer (VNA) for "hot" s22 injection measurements. The other port is connected to a spectrum analyzer and power meter for spectrum harmonics and power measurements. The switches that are required to switch the DUT output signal between these ports need to be high-power switches and are subject to "hot-switching" situations leading to early failure.

What is needed is a combination of essential power amplifier measurement functions and measurement systems self-test capability into one RF circuit without the need for high-power RF switches or DUT disconnections providing for high reliability, high repeatability, low costs, and high accuracy.

SUMMARY

One advantage of embodiments described in present application is that only one test setup is required to perform a variety of characterization measurements. Another advantage of embodiments described herein is that calibration can be performed without any physical changes to the test setup. Other advantages are apparent from the description herein.

These and other advantages are achieved, for example, in an apparatus that includes an internal amplifier coupled to a network analyzer, a first switch coupled between the internal amplifier and the network analyzer, a second switch coupled between the internal amplifier and the network analyzer, a third switch coupled between a device under test and the network analyzer, a first air-line directional coupler coupled between the second switch and the device under test, and a first attenuator coupled to the first air-line directional coupler.

These and other advantages are also achieved, for example, in a system that includes the apparatus described above, a network analyzer coupled to the apparatus, and a device under test coupled to the apparatus.

These and other advantages are further achieved, for example, in a system that includes a network analyzer, a device under test having an input and an output, an internal amplifier, having an input and an output, coupled to the network analyzer, a first switch coupled between the input of the internal amplifier and the network analyzer, a second switch coupled between the output of the internal amplifier and the network analyzer, a third switch coupled between the input of the device under test and the network analyzer, a first air-line directional coupler, having an input, a main-line output, and a coupled-line input, coupled between the second switch and the output of the device under test, and a first attenuator coupled to the main-line output of the first air-line directional coupler, wherein the attenuator is a high-power attenuator.

These and other advantages are achieved, for example, in a method that includes providing a first signal at a predetermined first frequency to an input of a device under test. The first signal is provided by a measurement interface device. The method further includes receiving a harmonics signal at the measurement interface device from an output of the device under test and passing the harmonics signal through an input port of a main-line of a first air-line directional coupler disposed within the measurement interface device. The method also includes providing the harmonics signal from an output port of the main-line of the first air-line directional coupler to a spectrum analyzer coupled to the measurement interface device.

These and other advantages are also achieved, for example, in a method that includes providing a first signal at a predetermined first frequency to an input of a device under test. The first signal drives the device under test to full power output. The method also includes providing a second signal at a predetermined second frequency to an input of an internal amplifier disposed within a measurement interface device to provide an amplified second signal and providing the amplified second signal to a wideband isolator disposed within the measurement interface device to provide an isolated second signal. The method further includes passing the isolated second signal through a coupled-line of a first air-line directional coupler to a main-line of the first air-line directional coupler disposed within the measurement interface device to provide a coupled second signal and providing the coupled second signal to an output of the device under test. The device under test reflects a portion of the coupled signal as a first reflected signal. The method also includes passing the first reflected signal through an input port of a main-line of a second air-line directional coupler disposed within the measurement interface device to a coupled-line of the second air-line directional coupler to provide a first coupled reflected signal and providing the first coupled reflected signal from an output port of the coupled-line of the second air-line directional coupler to an attenuator to produce a first attenuated reflected signal. The method further includes providing the first attenuated reflected signal to a first receiver disposed within a network analyzer coupled to the measurement interface device.

These and other advantages are further achieved, for example, in a method that includes steps of directly coupling an input port to an associated output port in a network analyzer, connecting a first cable to a first interface port in the network analyzer and connecting a second cable to a second interface port in the network analyzer. The first cable terminates at a first unconnected end with a first calibration standard. The second cable terminates a second unconnected end with a second calibration standard. The method also includes initiating a calibration program and recording a parameter deviation of the network analyzer, the first cable, and the second cable.

DESCRIPTION OF THE DRAWINGS

The detailed description will refer to the following drawings, wherein like numerals refer to like elements, and wherein.

DETAILED DESCRIPTION

Figure 1:
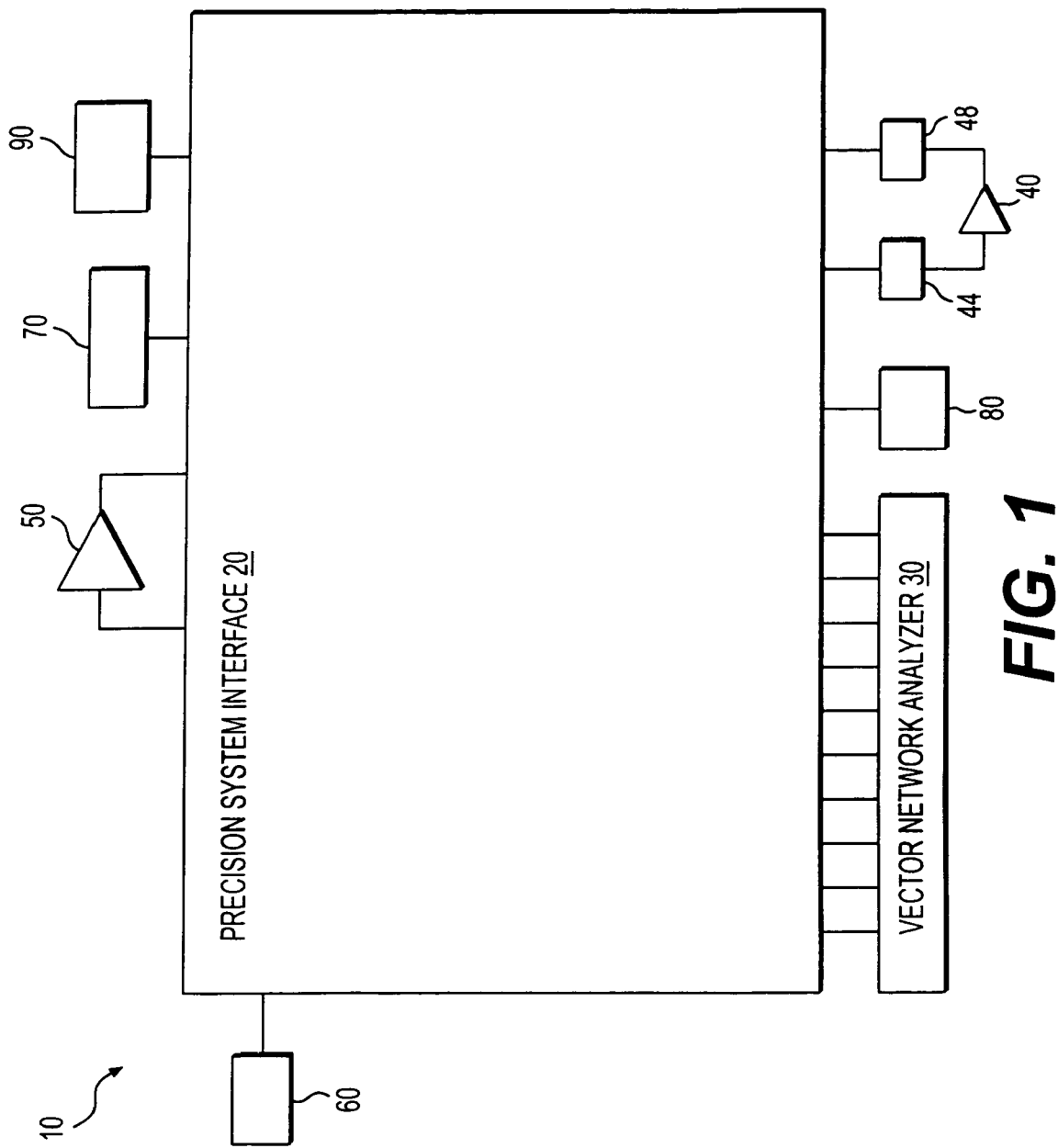
FIG. 1 is a block diagram of a power amplifier measurement system.

FIG. 1 is a block diagram of an embodiment of a power amplifier measurement system ("measurement system") for taking essential characterization measurements of a power amplifier or, in general, devices under test such as preamplifiers, filters and attenuators. The measurement system, designated generally by reference number 10, includes: Precision System Interface 20; Vector Network Analyzer 30; device under test 40; Test Port 1 44; Test Port 2 48; external linear driver amplifier 50; signal generator 60; spectrum analyzer 70; first power meter 80; and second power meter 90.

Figure 2:
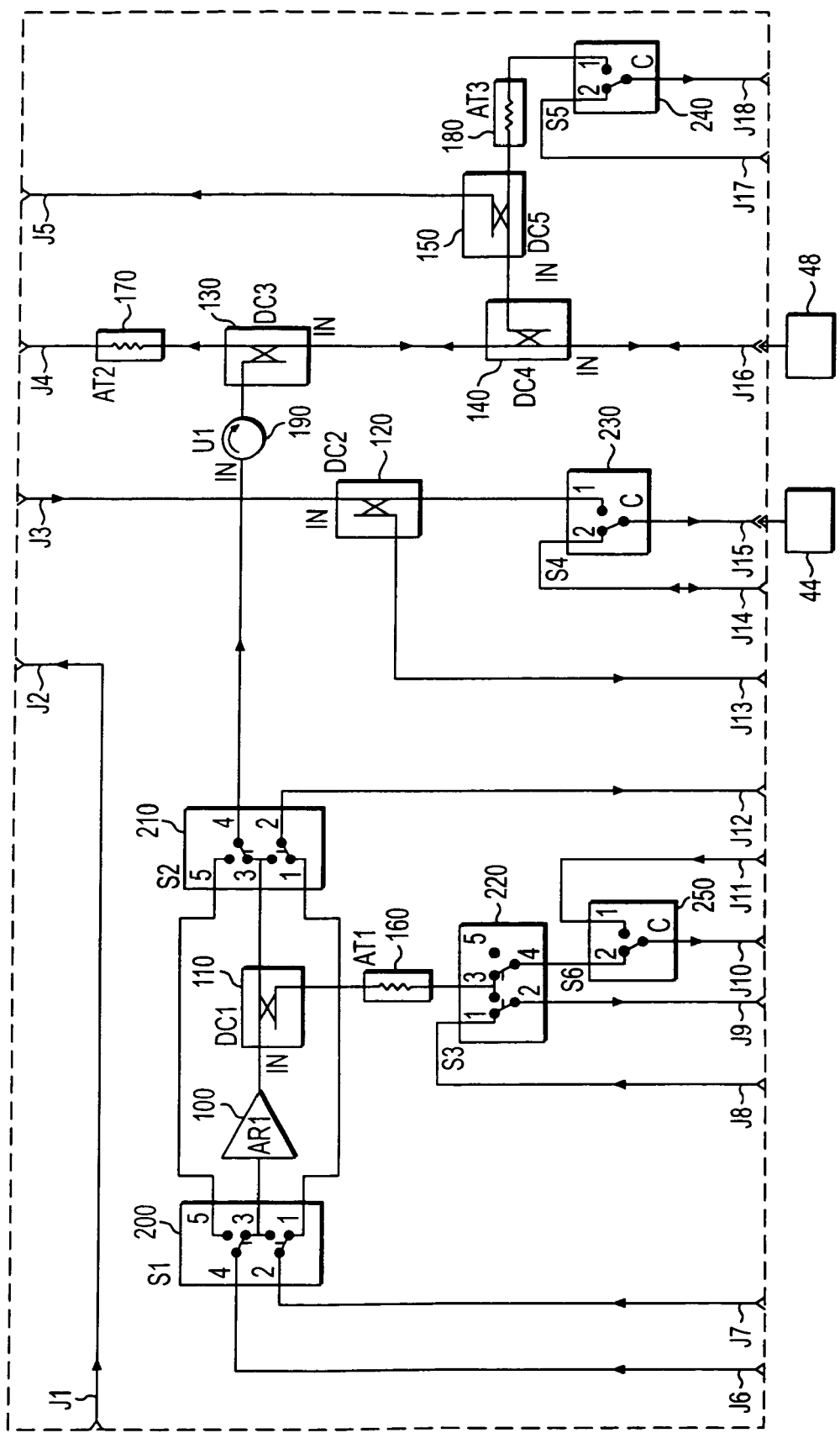
FIG. 2 is a schematic of a precision system interface for use in the power amplifier measurement system.

FIG. 2 is a schematic of an embodiment of Precision System Interface (PSI) 20. PSI 20 includes internal booster amplifier 100; directional couplers 110, 120, and 150; air-line directional couplers 130 and 140; attenuators 160 and 180; high-power attenuator 170; wide band isolator 190; and switches 200, 210, 220, 230, 240, and 250. PSI 20 also includes ports designated J1 through J18. Although illustrated separately in FIG. 1, Test Port 1 44 and Test Port 2 48 are actually preferably part of PSI 20, allowing the device under test (DUT) 40 to connect directly to PSI 20. By connecting DUT 40 to PSI 20, any characterization measurements of DUT 40 can be made without switching the testing setup since PSI 20 acts as a measurement interface between DUT 40 and any signal generation or measurement equipment.

The air-line directional couplers 130 and 140 have a main-line input port, a main-line output port and coupled-line port. The main-line input port is denoted by the label "IN". An internal main-line conductor ("main-line") from the main-line input port to the main-line output port is built from suspended stripline, so that the surrounding dielectric material is air. This enables the air-line directional coupler to carry high power with low loss and also to have a broad frequency response. A signal entering at the main-line input port will not degrade significantly before it exits the main-line output port. This is opposed to a printed stripline-on-board type of construction whose frequency response would degrade more as the frequency increases.

The coupling function in most directional couplers is accomplished by a length of conductor ("the coupled-line") parallel to the main-line, and approximately one quarter wavelength long. The coupled-line is coupled to the main-line and is connected to the coupled-line port. For example, at 1.5 GHz, the center frequency of the specified band, the conductor is about five centimeters long. Frequencies in this band will couple to the coupled-line only in one direction at 10, 20 or 30 dB lower power, depending on the model. A small portion of the main energy is coupled off onto the coupled-line while the main signal itself is relatively unaffected. For instance, a 20 dB coupler will transmit about 99 percent of the incoming energy to its main-line output port, and 1% to the coupled port. If power is input into the main-line output port, however, almost no power (i.e., only 0.01 percent) will be coupled to the coupled-line port, hence the name "directional" coupler.

Although the coupling function of the air-line directional couplers 130 and 140 is only rated "in-band" (from 0.8 to 2.2 GHz, for example) and falls off rapidly on either side of that band (due to the quarter wavelength relationship), the main-line performs well through at least 13 GHz. High-power couplers that perform as well on their coupled-line as on their main-line (to allow harmonics measurements at the coupled-line) are much more expensive than air-line narrow-band directional couplers. Using air-line narrow-band directional couplers allows measurement of harmonics (e.g., 2×2 GHz=4 GHz, 3× 2 GHz=6 GHz, up to the $6^{th}$ harmonic of 2 GHz=12 GHz) using a spectrum analyzer without much degradation for much lower costs. In a preferred embodiment, only air-line directional couplers 130 and 140 need to pass frequencies on their main-lines that are higher than their rated frequency band of their coupled-lines. The coupled-line of all directional couplers is reciprocal. When a signal is input into the coupled-line port, a reduced version of the signal will appear at the main-line input but not at the main-line output.

Figure 3:
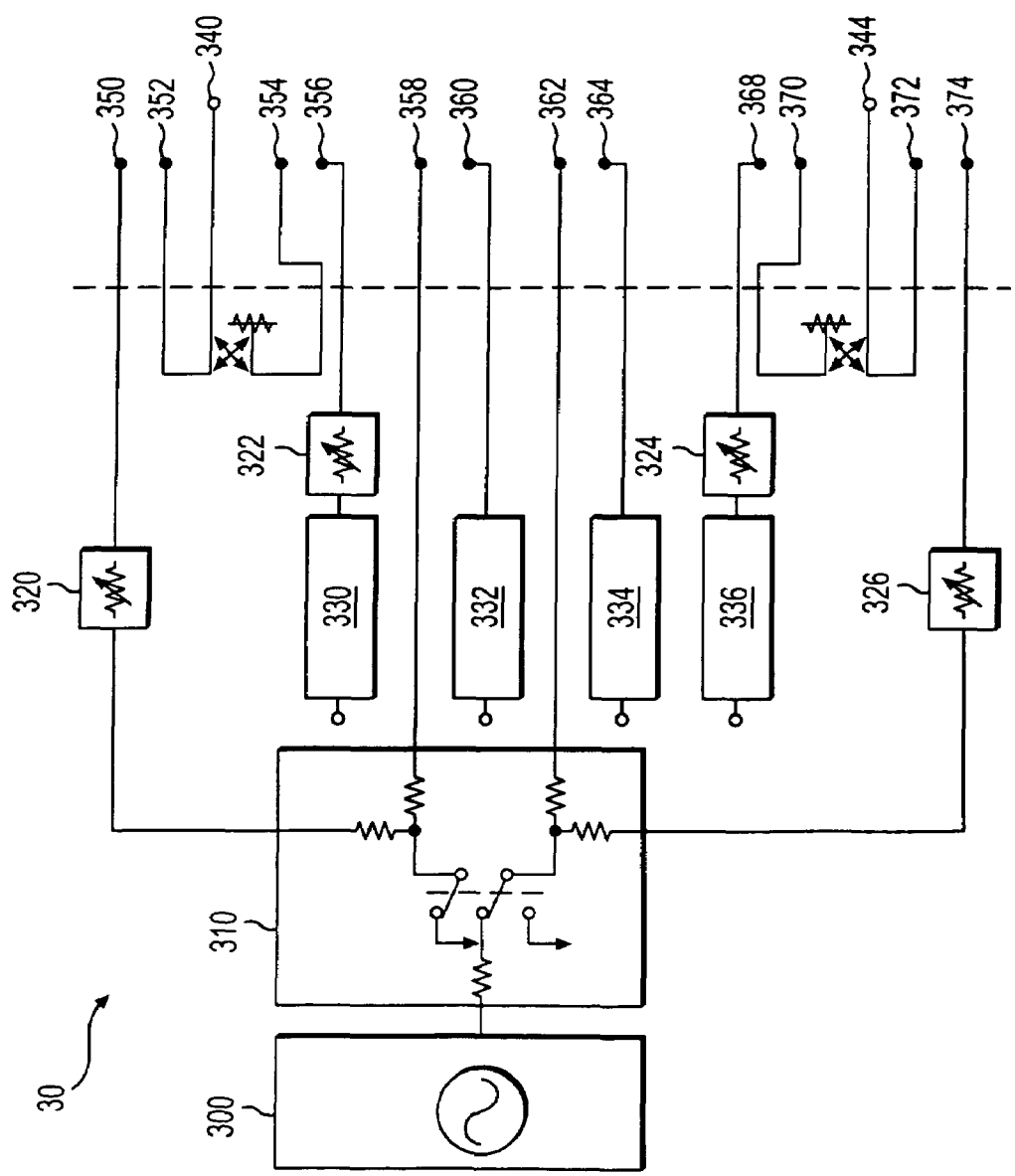
FIG. 3 is a diagram of a vector network analyzer for use in the power amplifier measurement system.

FIG. 3 shows an embodiment of Vector Network Analyzer (VNA) 30. VNA 30 includes: source generator 300; switch splitter leveler 310; step attenuators 320, 322, 324, and 326; A Receiver 330; R1 Receiver 332; R2 Receiver 334; and B Receiver 336. VNA 30 also includes: VNA Port 1 340 and VNA Port 2 344. VNA 30 further includes ports A Source Out 350; A Coupler In 352; A Out 354; A In 356; R1 Out 358; R1 In 360; R2 Out 362; R2 In 364; B In 368; B Out 370; B Coupler In 372; and B Source Out 374. The dotted line in FIG. 3 denotes the front panel of VNA 30. All of the connections shown to the right of the dotted line are external ports on the front panel of VNA 30 that allow user access to the internal receivers and couplers.

The switch splitter leveler 310 has two functions. The switch splitter leveler 310 takes a signal generated by source generator 300 and directs the signal to either VNA Port 1 340 or VNA Port 2 344. The switch splitter level 310 can also divide the signal generated by source generator 300 into a signal that exits VNA 30 through VNA Port 1 340 or VNA Port 2 344 and a signal that goes to reference receiver R1 Receiver 332 or reference receiver R2 Receiver 334, so that ratio measurements may be made. For example, small-signal s11="A" Receiver signal divided by R1 signal. In this way, the signal being measured by the reference receivers R1 Receiver 332 and R2 Receiver 334 can be derived either directly from the source generator 300 or from signals propagating through PSI 20 during characterization measurement operations of the device under test 40, as described below.

Figure 4:
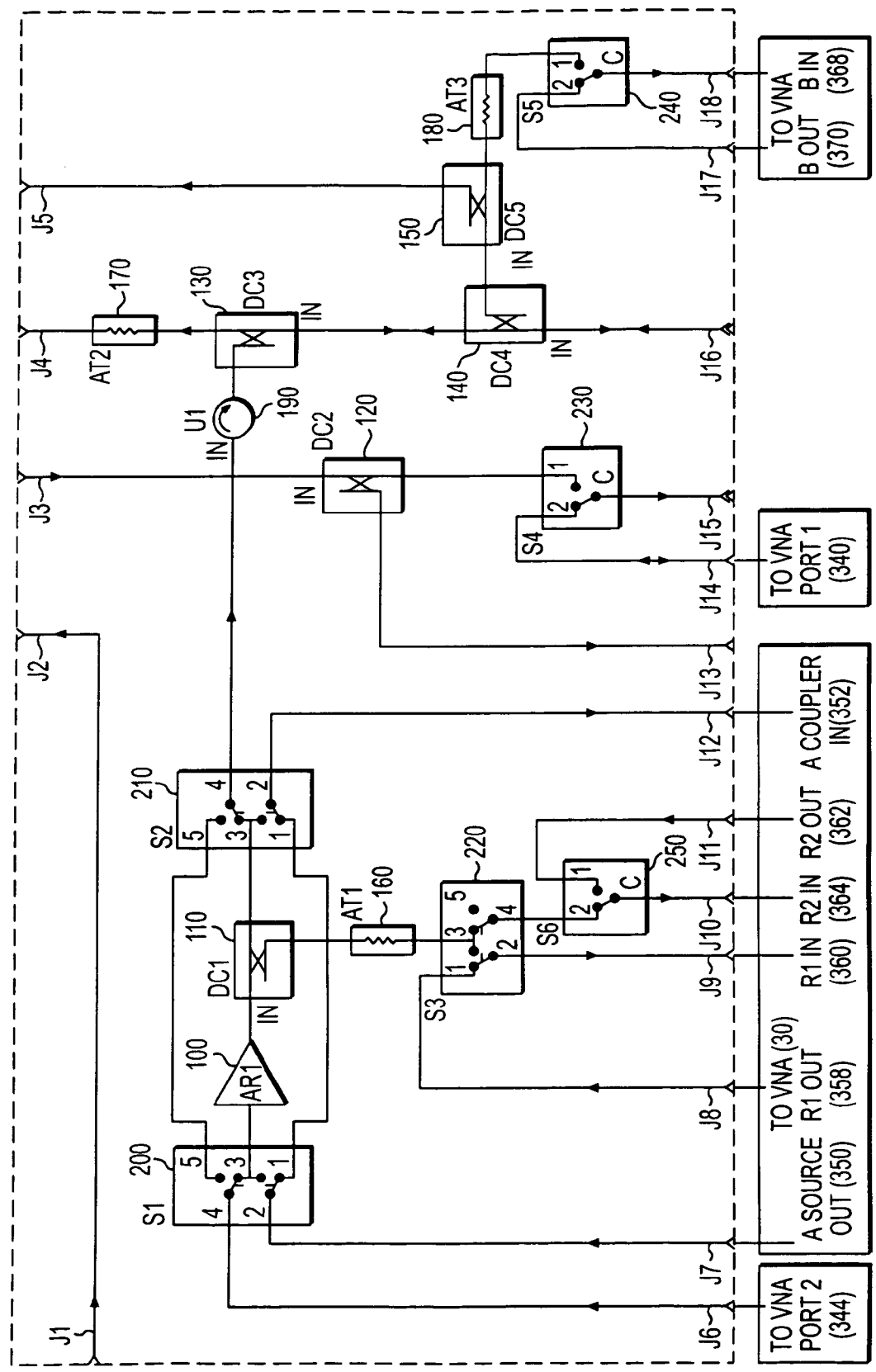
FIG. 4 is a schematic illustrating connections between the precision system interface and the vector network analyzer.

FIG. 4 is a schematic illustrating how PSI 20 connects with VNA 30 in an embodiment of measurement system 10. PSI 20 connects to VNA Port 1 340 and VNA Port 2 344 using PSI 20 ports J14 and J6, respectively. PSI 20 also connects with port A Source Out 350 of VNA 30 using port J7 and to port A Coupler In 352 of VNA 30 using port J12. PSI 20 further connects to port R1 In 360 using port J9 of VNA 30 and to port R1 Out 358 of VNA 30 using port J8. PSI 20 connects to port R2 In 364 of VNA 30 using port J10 and to port R2 Out 362 of VNA 30 using port J11. PSI 20 also connects to port B In 368 of VNA 30 using port J18 and to port B Out 370 of VNA 30 using port J17.

Figure 5:
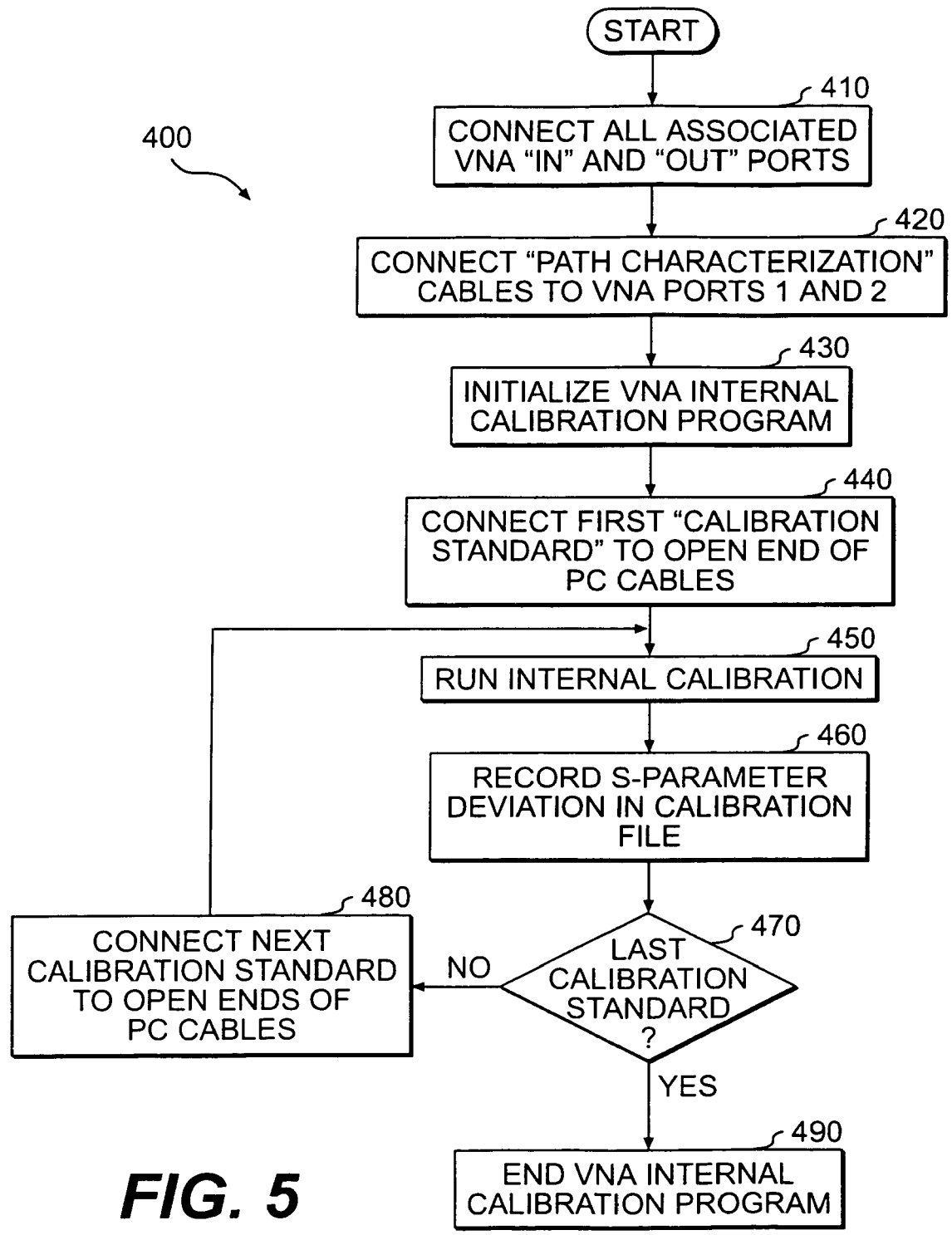
FIG. 5 is a flowchart illustrating a method for independent operation of the vector network analyzer.

FIG. 5 is a flowchart illustrating an embodiment of a method for calibrated independent operation of the VNA 30, designated generally by reference number 400. Independent operation method 400 includes the steps of: connecting all associated VNA "IN" and "OUT" ports, step 410; connecting "path characterization" (PC) cables to VNA Ports 1 and VNA Port 2, step 420; initializing the VNA internal calibration program, step 430; connecting the first "calibration standard" to open end of PC cables, step 440; running internal calibration, step 450; recording s-parameter deviation in calibration file, step 460; determining whether the last calibration standard has been connected, step 470; connecting the next calibration standard to open-ends of the PC cables, step 480; and ending the VNA internal calibration program, step 490.

The independent operation of VNA 30 is necessary for high accuracy measurements of low-power devices under test, or, more importantly, for measuring path loss in PSI 20 for calibration purposes before the system is ready to accurately measure DUT 40. In order to facilitate independent operation of VNA 30 all associated in and out ports of VNA 30, are connected to each other, step 410. For example, port A Source Out 350 and port A Coupler In 352 are connected to each other, port A Out 354 and port A In 356 are connected to each other, and port R1 Out 358 and port R1 In 360 are connected to each other.

Figure 6:
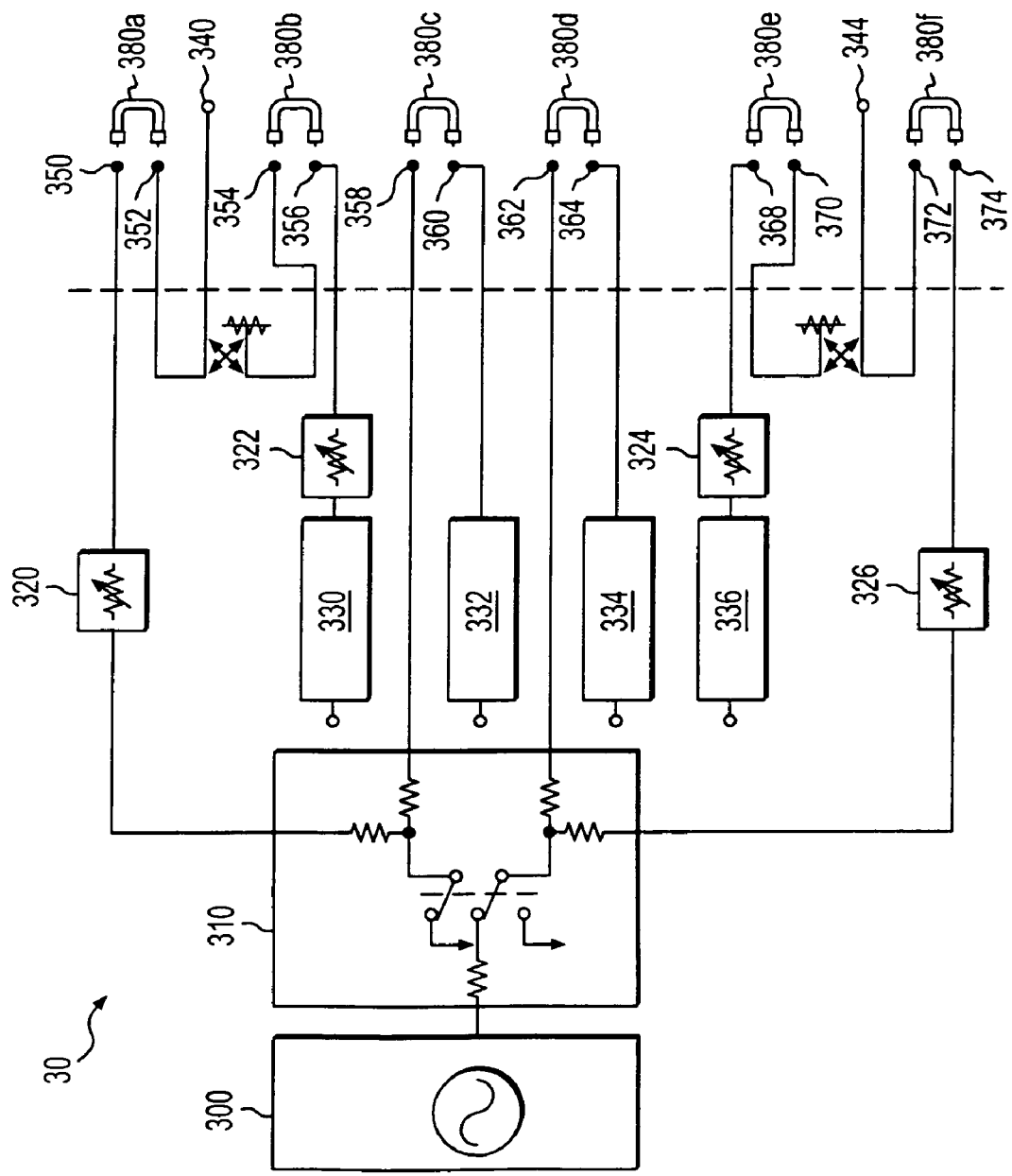
FIG. 6 is a schematic indicating jumpers used for independent operation of the vector network analyzer when the analyzer is not used in the power amplifier measurement system.

Connection of the associated VNA 30 ports may be accomplished in two ways: using jumper cables or using PSI 20. FIG. 6 show how these port connections may be accomplished using jumper cables. For example, A Source Out 350 and A Coupler In 352 may be connected using jumper 380A. R1 Out 358 and R1 In 360 may be connected using jumper 380C. R2 Out 362 and R2 In 364 may be connected by jumper 380D. Also B In 368 and B Out 370 may be connected by jumper 380E.

Figure 7:
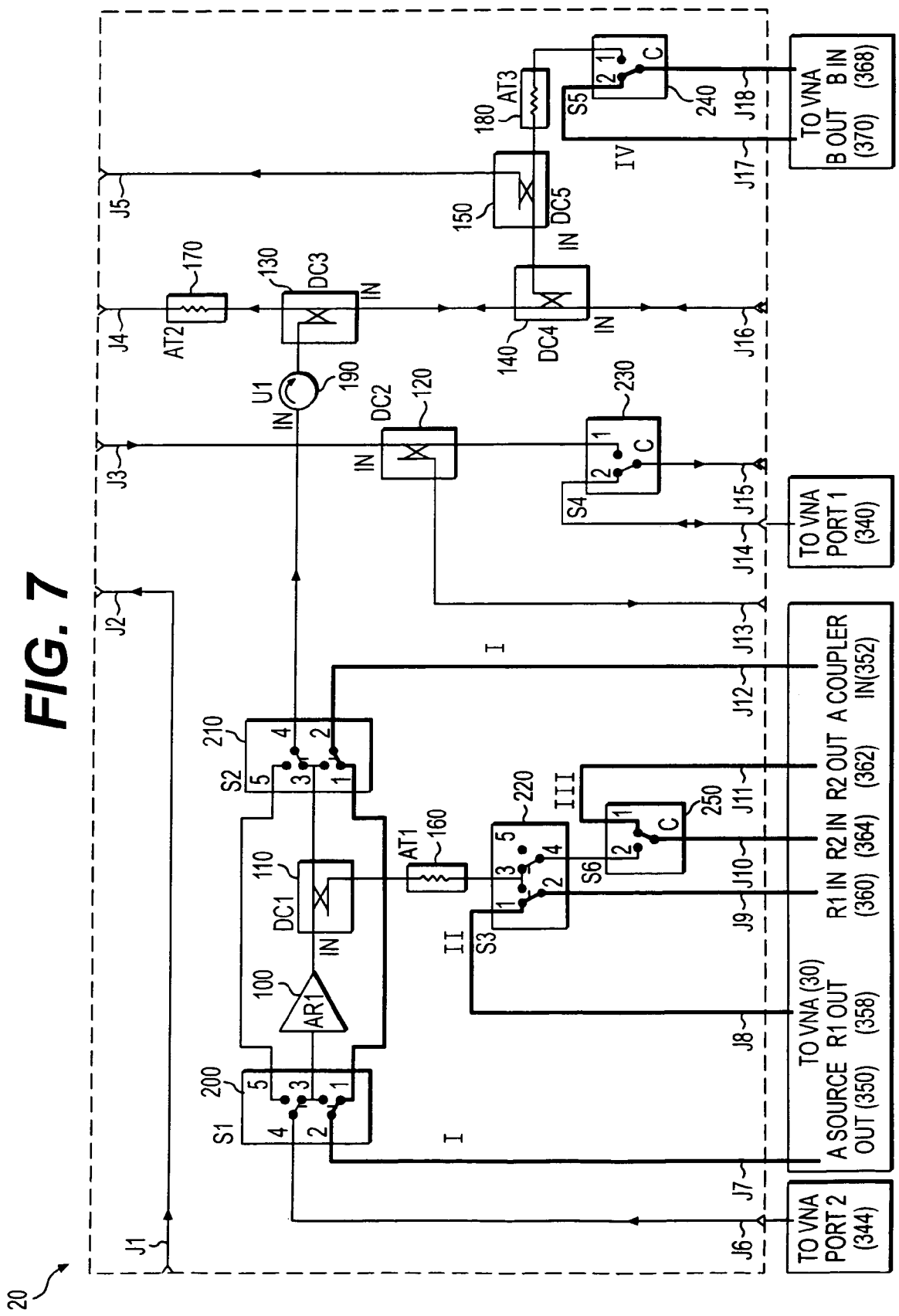
FIG. 7 is a schematic illustrating switch positions in the precision system interface for independent operation of the vector network analyzer.

In addition to the jumper cables to make the VNA port connections, FIG. 7 shows how these port connections may be accomplished directly using PSI 20. For example, A Source Out 350 and A Coupler In 352 may be connected using ports J7 and J12 of PSI 20 along path I by setting switches 200 and 210 to their 2-1 and 1-2 positions, respectively. R1 Out 358 and R1 In 360 may be connected using ports J8 and J9 of PSI 20 along path II by setting switch 220 to position 1-2. R2 In 364 and R2 OUT 362 may be connected using ports J10 and J11 of PSI 20 along path III by setting switch 250 to position to 1-C. Furthermore, B Out 370 and B In 368 may be connected using ports J17 and J18 of PSI 20 along path IV by setting switch 240 to position 2-C.

Referring back to FIG. 5, after the VNA IN and OUT ports have been connected, PC cables are connected to VNA Port 1 340 and Port 2 344, step 420. A "calibration reference plane" is then defined at the open ends of the PC cables. VNA internal calibration program is initialized, step 430, in order to perform calibration of the VNA 30. A first set of calibration standards is connected to the open ends of the PC cables, step 440. These calibration standards may include opens, shorts, and 50 ohm loads. Calibration may also be performed by connecting the ends of the PC cables together for a through reading. After connecting the first set of calibration standards to the open ends of the PC cables, step 440, the internal calibration program is run, step 450. This causes the s-parameter deviation of the VNA for the first set of calibration standards to be recorded in a calibration file, step 460. The calibration program then determines whether the last calibration standard has been connected to the PC cables, step 470. If the last calibration standard has not been connected, the next set of calibration standards is connected to the open end of the PC cables, step 480. If the last set of calibration standards has been connected, the VNA internal calibration program is ended, step 490.

The VNA internal calibration program is programmed to know the "ideal" calibration standards that should be measured for VNA 30 and records the difference from the actual s-parameters it "sees" at the end of the PC cables. The VNA internal calibration program stores these differences in a calibration file so that when actual measurements are made with the VNA and the PC cables, the effect of the VNA and the PC cables will be subtracted out by the differences stored in the calibration file. The VNA 30 will thus display the s-parameters that actually exist at the device under test to which the PC cables are connected. Once VNA 30 plus the PC cables are calibrated, independent calibrations may be run on any of the measurement devices being used to characterize the DUT 40.

In addition to calibration of VNA 30, path characterization must be performed on the rest of measurement system 10. A path is defined as the route between a measurement instrument, i.e., signal generator 60, to the measurement instrument test ports or from the measurement instrument test ports to DUT 40 test ports 44 and 48. Performing path characterization preserves the instrument accuracy at system 10 test ports. There are five paths for non-VNA measurements: signal generator to DUT input; signal generator to power meter; DUT input to power meter; DUT output to spectrum analyzer; and Amplifier Distortion Test Set (ADTS) reference to DUT paths (for delay measurements only). These five paths are characterized in terms of phase and amplitude. Each path is treated as a device and measurements are done using the VNA.

These paths can potentially be non-insertible. If a device (e.g., DUT 40) uses a different type of connector than the connectors used on the test port (e.g. test ports 44, 48) cables, the device cannot connect to the test cables without using adapters. Such a device is called a non-insertible device. Even in a situation in which the device connectors and the test cable connectors are of the same type, the device could become non-insertible if the device's connector does not have the opposite connector "sex" than the connector on the test cable port. For example, if the device has an SMA female connector on the device's input port and the connector on the test port cable also has a SMA female connector, then the device is non-insertible.

Figure 8:
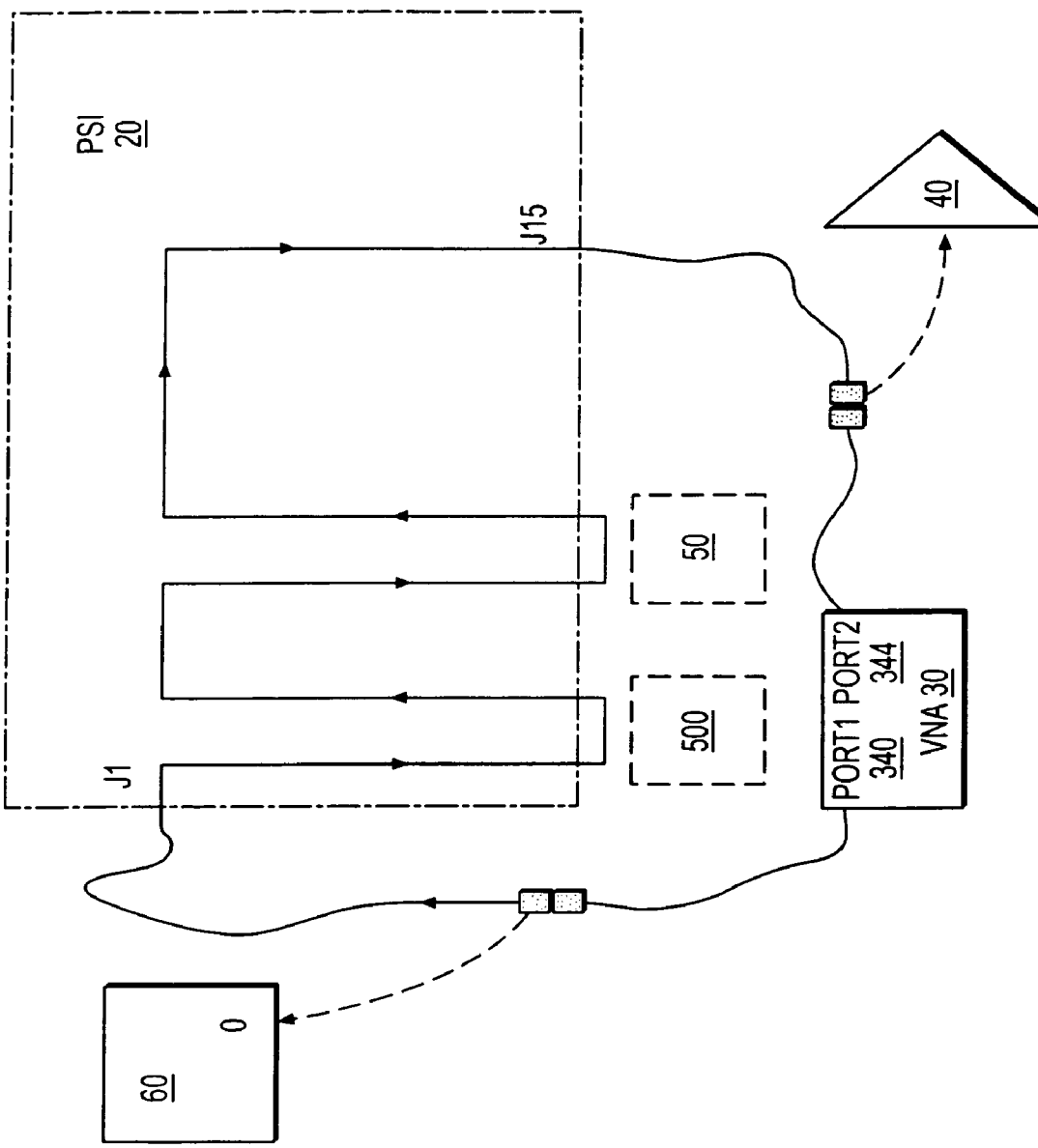
FIG. 8 is a block diagram illustrating system setup for signal generator to device under test path characterization.

FIG. 8 is a block diagram illustrating the measurement system 10 for signal generator 60 to DUT 40 path characterization measurements. PSI 20 is used to connect signal generator 60 and DUT 40, as described previously. The path is characterized in terms of s-parameters. Subsequent correction for the path permits correction for path loss and also mismatch loss at the signal generator 60 and the DUT 40 input.

As mentioned previously, the paths are potentially non-insertible. Test adapters can be used to make the connection between the measurement equipment and the DUT 40. However, when performing characterization measurements on the device, the adapters may not be used (depending on the device connector configuration). Therefore, the effect of the adapters used during calibration has to be removed during the characterization measurement procedure. In situations in which adapters are used on the VNA PC cables, the effect of the adapters are removed by embedding techniques. Embedding allows the calibration reference plane to be moved from the end of the adapter to the end of the test port cable connector.

Figure 9:
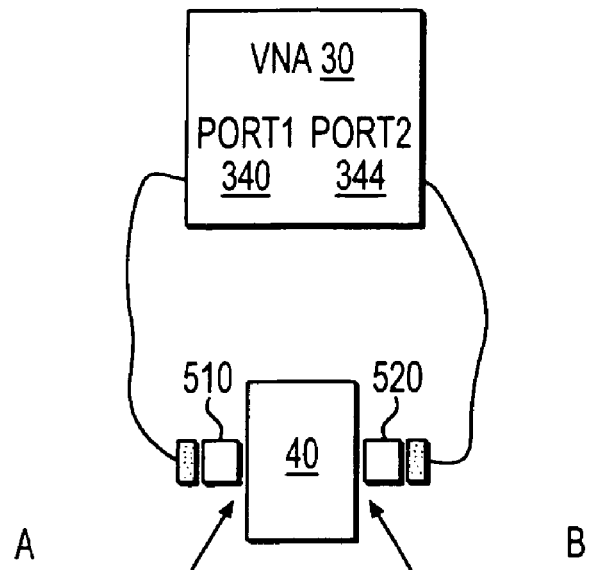
FIG. 9 is a block diagram illustrating de-embedding of a device under test adapters for path characterization.

FIG. 9 illustrates two test adapters, Adapter A 510 and Adapter B 520, which are used to connect VNA 30 to DUT 40 during system calibration. Embedding moves the effective calibration reference plane to the end of Adapter A 510 and Adapter B 520 mathematically by using an adapter model. The adapter information is "embedded" in the VNA calibration files, where the information can be subtracted from the DUT 40 characterization measurements to obtain the actual DUT 40 characterization parameters. The reverse of this embedding process is called "de-embedding".

Figure 10:
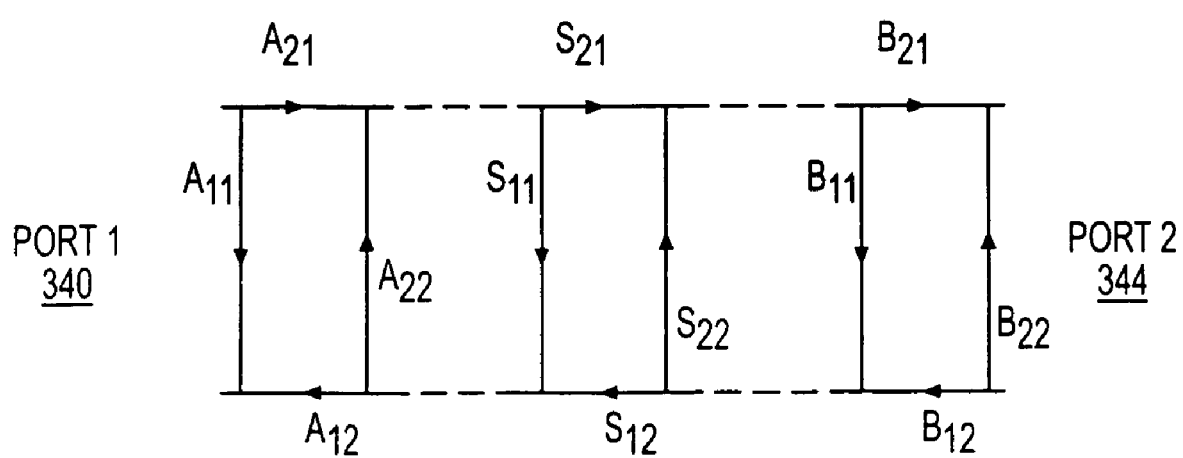
FIG. 10 is a diagram of the s-parameter measurement of the test adapters.

Initially, VNA 30 is calibrated as described previously, with reference to FIG. 6. The error terms from VNA 30 are read and modified using the test adapters s-parameters. The modified error terms are written back to VNA 30, which allows the calibration reference plane to move from the end of the PC cables to the end of the adapters. The s-parameter measurement of the test adapters is illustrated in FIG. 10.

Figure 11:
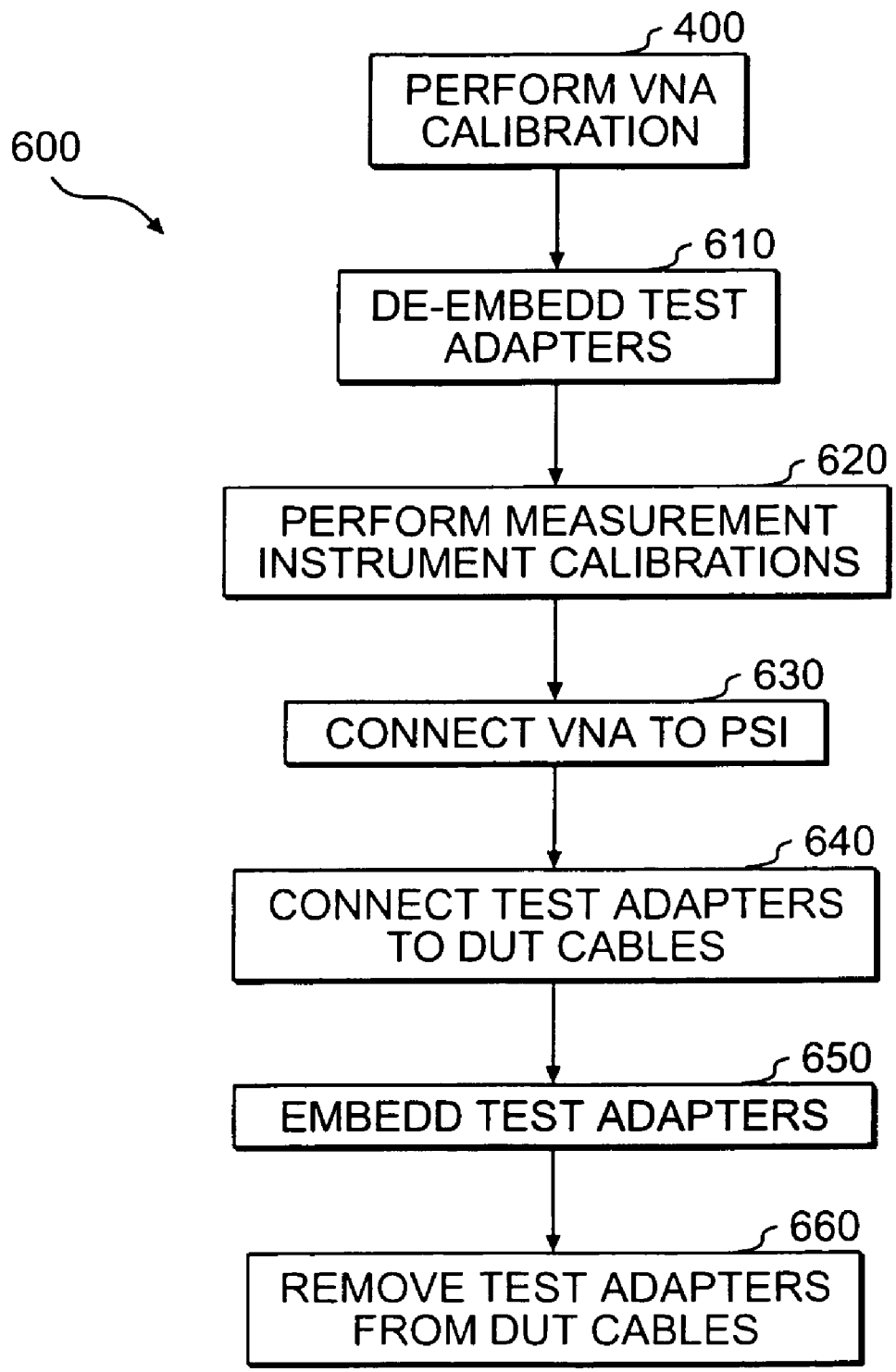
FIG. 11 is a flowchart describing a method for path characterization.

FIG. 11 is a flow chart describing an embodiment of a method for path characterization. The path characterization method, denoted generally by reference number 600, includes: performing VNA 30 calibration, step 400 (see FIG. 5); de-embedding the test adapters, step 610; performing measurement instrument calibrations, step 620; connecting VNA 30 to PSI 20, step 630; connecting the test adapters to DUT 40, step 640; embedding the test adapters, step 650; and removing the test adapters from DUT 40, step 660.

VNA 30 calibration, step 400, is performed as described previously, with reference to FIG. 5. The test adapters are de-embedded, step 610, according to the method described above, with reference to FIG. 9. The various paths are then characterized and calibrated, step 620, as described in detail with reference to FIGS. 12A and 12B. VNA 30 is connected to PSI 20, step 630, and the test adapters are connected to the PC cables of DUT 40, step 640. The test adapters are then embedded as described above, with reference to FIG. 9. The test adapters are then removed from DUT 40, step 660, so that DUT 40 can be reconnected to PSI 20 for characterization measurement operation of measurement system 10, as described below.

Figure 12A:
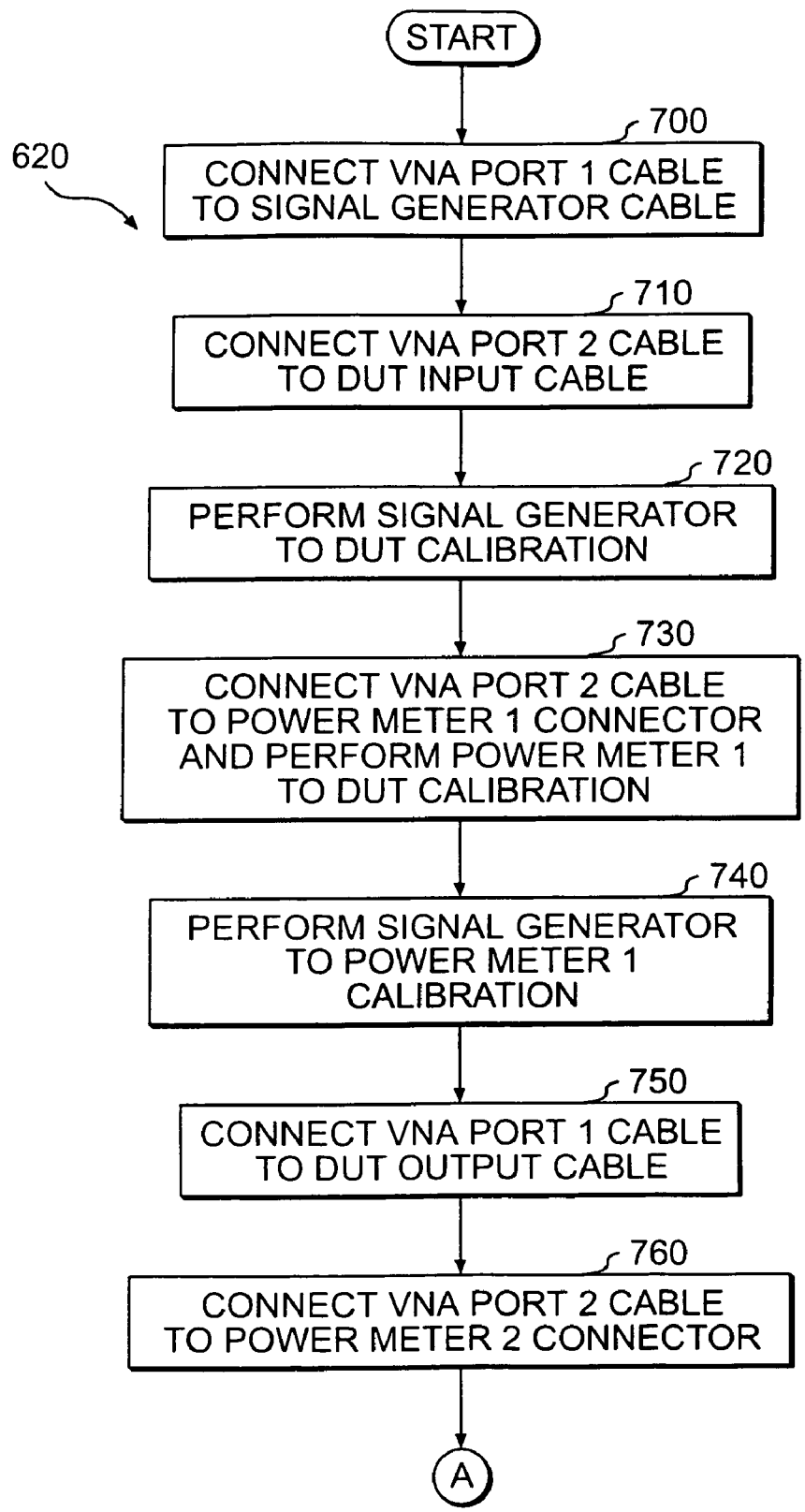
FIGS. 12A and 12B are flowcharts describing a method for measurement instrument calibration.
Figure 12B:
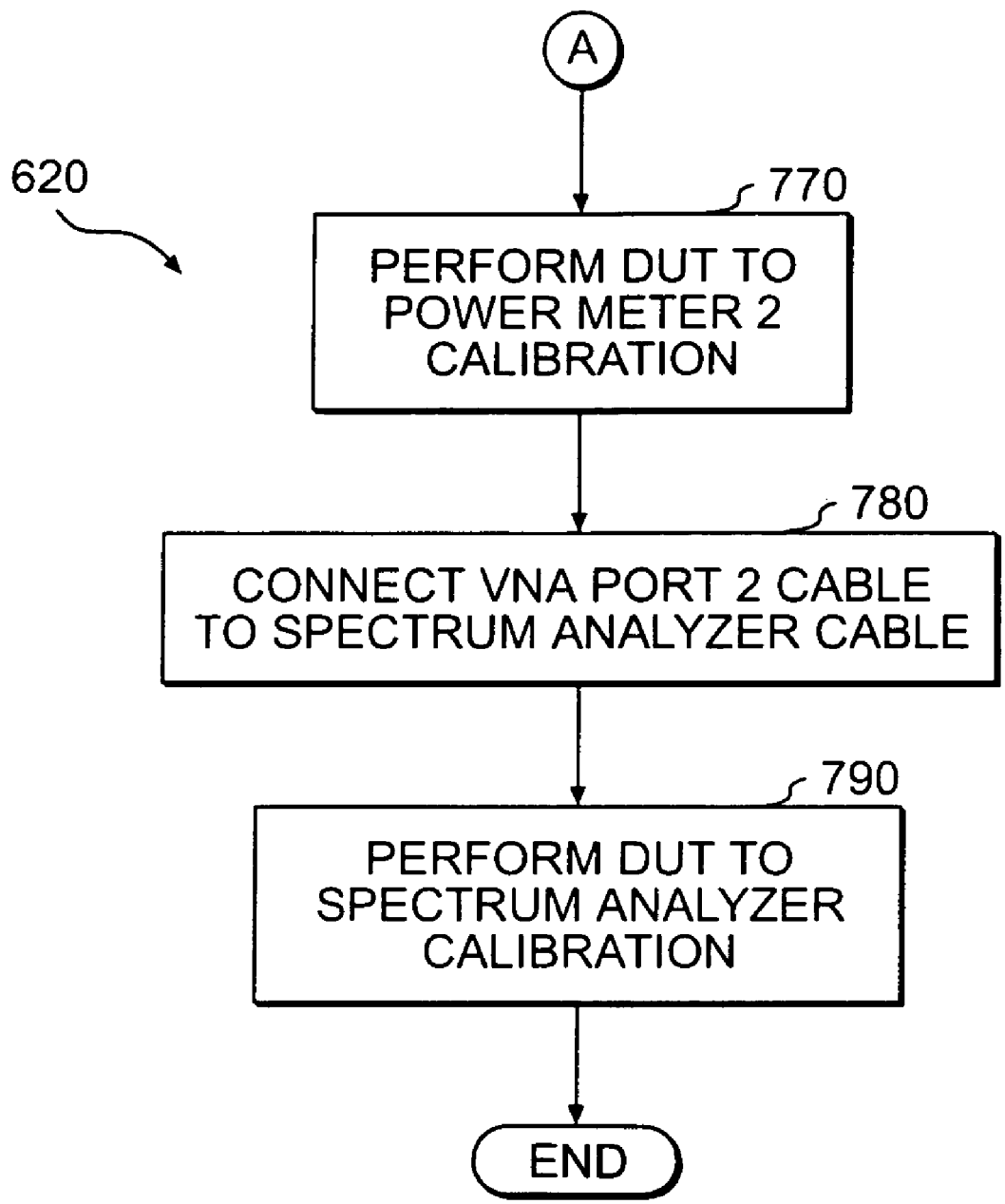

FIGS. 12A and 12B illustrate flow charts describing an embodiment of a method for measurement instrument calibration corresponding to step 620 in FIG. 11. After the test adapters have been de-embedded (step 610 in FIG. 11), VNA Port 1 340 cable is connected to signal generator 60 cable (at signal generator 60 end, as shown in FIG. 8), step 700, and VNA Port 2 cable is connected to the input cable of DUT 40, step 710, as shown in FIG. 8. The path characterization and path loss, or calibration measurements, between the end of the signal generator 60 cable and the end of the DUT 40 input cable, is then performed, step 720. The path characterization and path loss, or calibration measurements are performed by taking the s-parameter measurements of the path. VNA Port 2 cable is then connected to first power meter 80 connector on PSI 20, port J13, and calibration measurements performed, step 730. The path characterization and path loss, or calibration measurements, between the signal generator 60 and first power meter 80, is then calculated, step 740, by taking the difference between the calibration measurements performed at steps 720 and 730.

VNA Port 1 340 is then connected to the end of DUT 40 output cable, step 750, and VNA Port 2 is connected to second power meter 90 connector on PSI 20, port J5, step 760. The path characterization and path loss, or calibration measurements, between DUT 40 and the second power meter 90, is then performed, step 770, as shown in FIG. 12B. VNA Port 2 is then connected to the spectrum analyzer 70 cable (at the spectrum analyzer 70 end of the cable), step 780. The path characterization and path loss, or calibration, between DUT 40 and the spectrum analyzer 70 is then performed, step 790.

Figure 13:
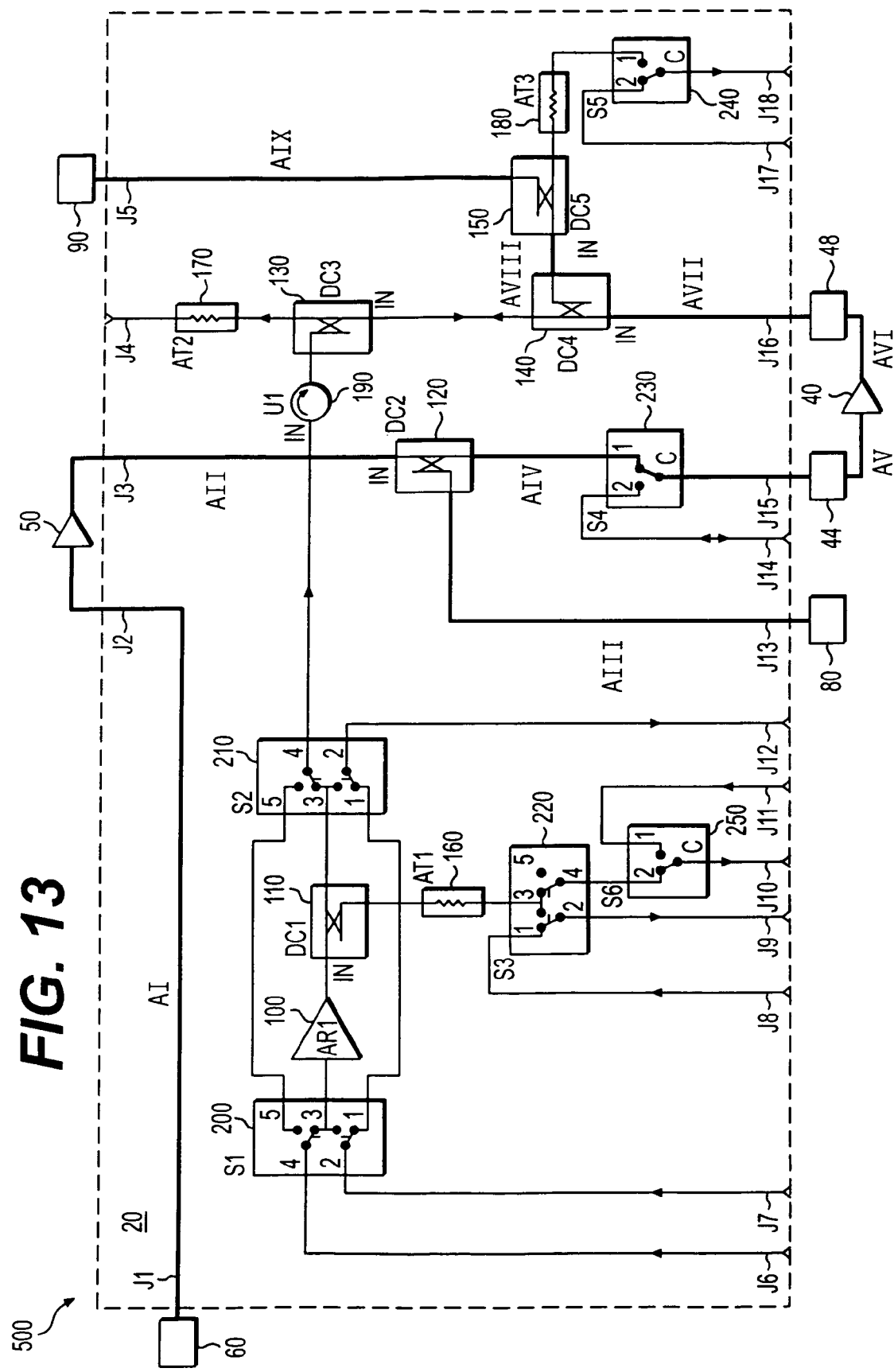
FIG. 13 is a schematic illustrating signal propagation through the precision system interface for input and output power measurements.

FIG. 13 is schematic illustrating signal propagation through PSI 20 for input and output power measurements. Signal generator 60 generates an input power signal, which enters PSI 20 at port J1 and exits PSI 20 at port J2, denoted by path AI. The signal is amplified by external linear driver amplifier 50. The amplified signal reenters PSI 20 at port J3 and travels to directional coupler 120 along path AII. The amplified signal enters the main-line input of directional coupler 120 and a coupled signal exits the coupled-line output of directional coupler 120. The signal then exits PSI 20 at port J13 along path AIII and is measured by first power meter 80. The amplified signal exits the main-line output of directional coupler 120 and passes through switch 230 in the 1-C position along path AIV. The signal exits PSI 20 at port J5 and passes through Test Port 1 44 to enter the input of the DUT 40 along path AV. The signal exits the output of the DUT 40 and passes through Test Port 2 48 along path AVI entering PSI 20 at port J16. The output signal enters air-line directional coupler 140 along path AVII and is coupled off by air-line directional coupler 140, exiting 140 at the coupled-line output. The coupled output signal travels along path AVIII to enter the input of directional coupler 150. The output signal is further coupled by directional coupler 150 and exits the coupled-line output of directional coupler 150. The coupled signal exits PSI 20 at port J5 along path AIX and is measured by second power meter 90.

Figure 14:
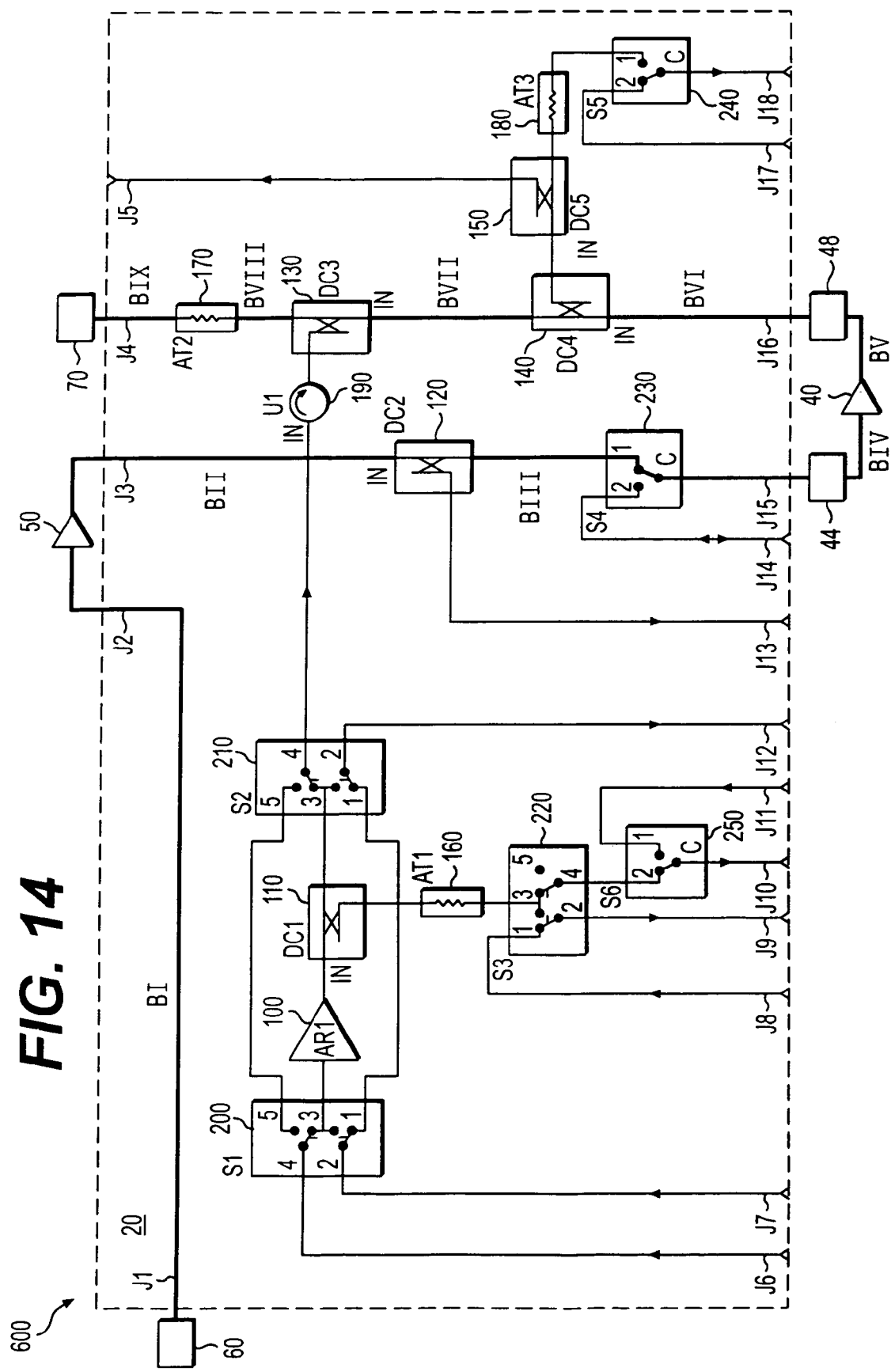
FIG. 14 is a schematic illustrating signal propagation through the precision system interface for vector spectrum analysis measurements.

FIG. 14 is a schematic illustrating signal propagation through PSI 20 for Vector Spectrum Analysis Measurements. Signal generator 60 generates an input signal at frequency F1, which enters PSI 20 at port J1 and exits PSI 20 at port J2, denoted by path BI. In one embodiment, the input signal is amplified by external linear driver amplifier 50. The amplified signal re-enters PSI 20 at port J3 and travels to directional coupler 120 along path BII. The amplified signal passes through main-line of directional coupler 120. The signal passes through switch 230 in the 1-C position and exits PSI 20 at port J15 along path BIII. The signal passes through Test Port 1 44 and enters the input of DUT 40 along path BIV. A generated harmonics signal exits the output of DUT 40 and passes through Test Port 2 48 along path BV. The harmonic signal enters PSI 20 at port J16 and passes through the main-line input of air-line directional coupler 140 along path BVI. The harmonic signal exits the main-line output of air-line directional coupler 140 and passes through the main-line input of air-line directional coupler 130 along path BVII. The signal exits the main-line output of air-line directional coupler 130 and passes through high-power attenuator 170 along path BVIII. The attenuated harmonic signal exits high-power attenuator 170 along path BIX and exits PSI 20 at port J4. The attenuated harmonic signal is then measured by spectrum analyzer 70.

Figure 15A:
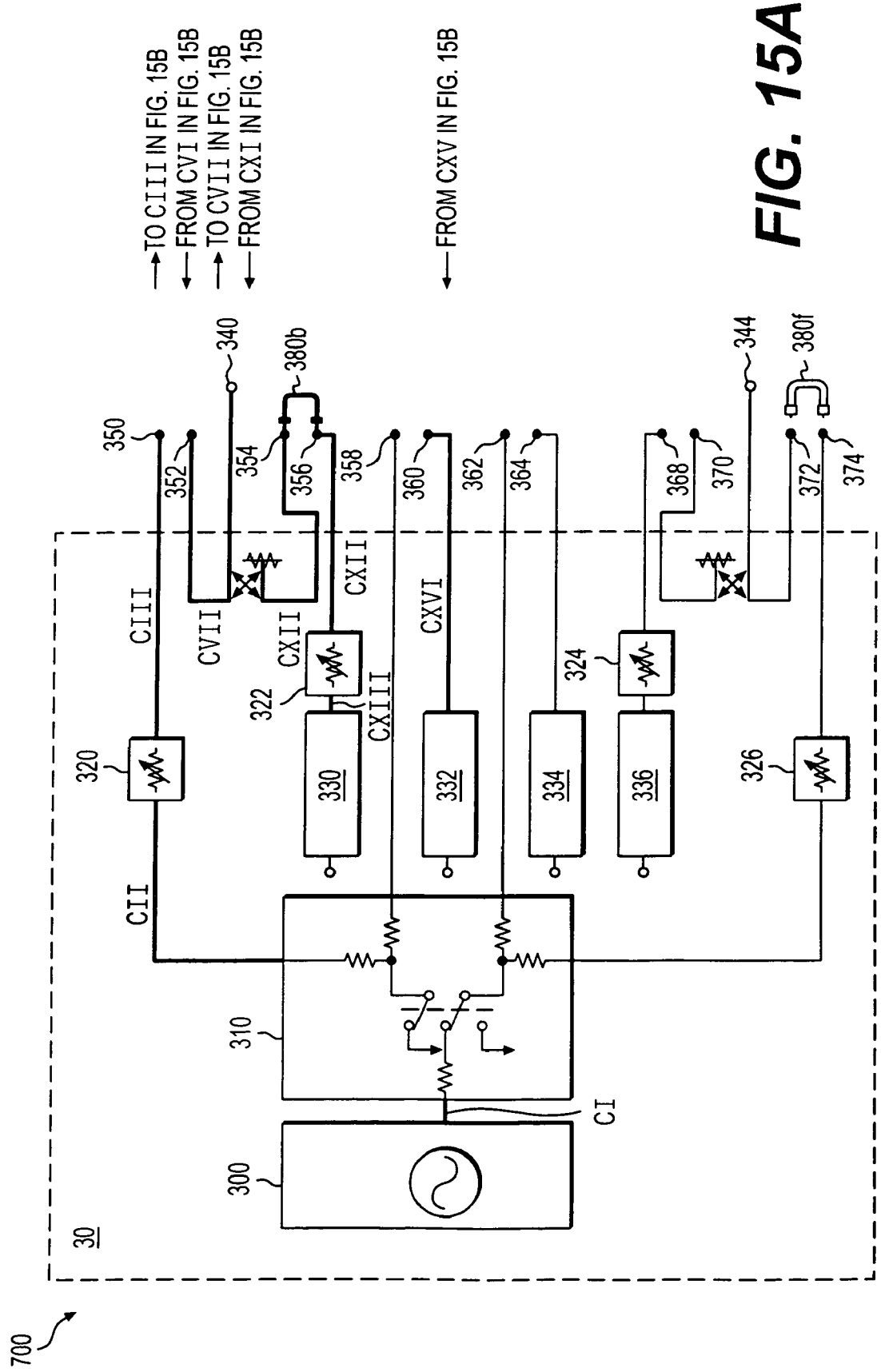
FIG. 15A is a schematic illustrating signal propagation through the vector network analyzer for hot S11 measurements.
Figure 15B:
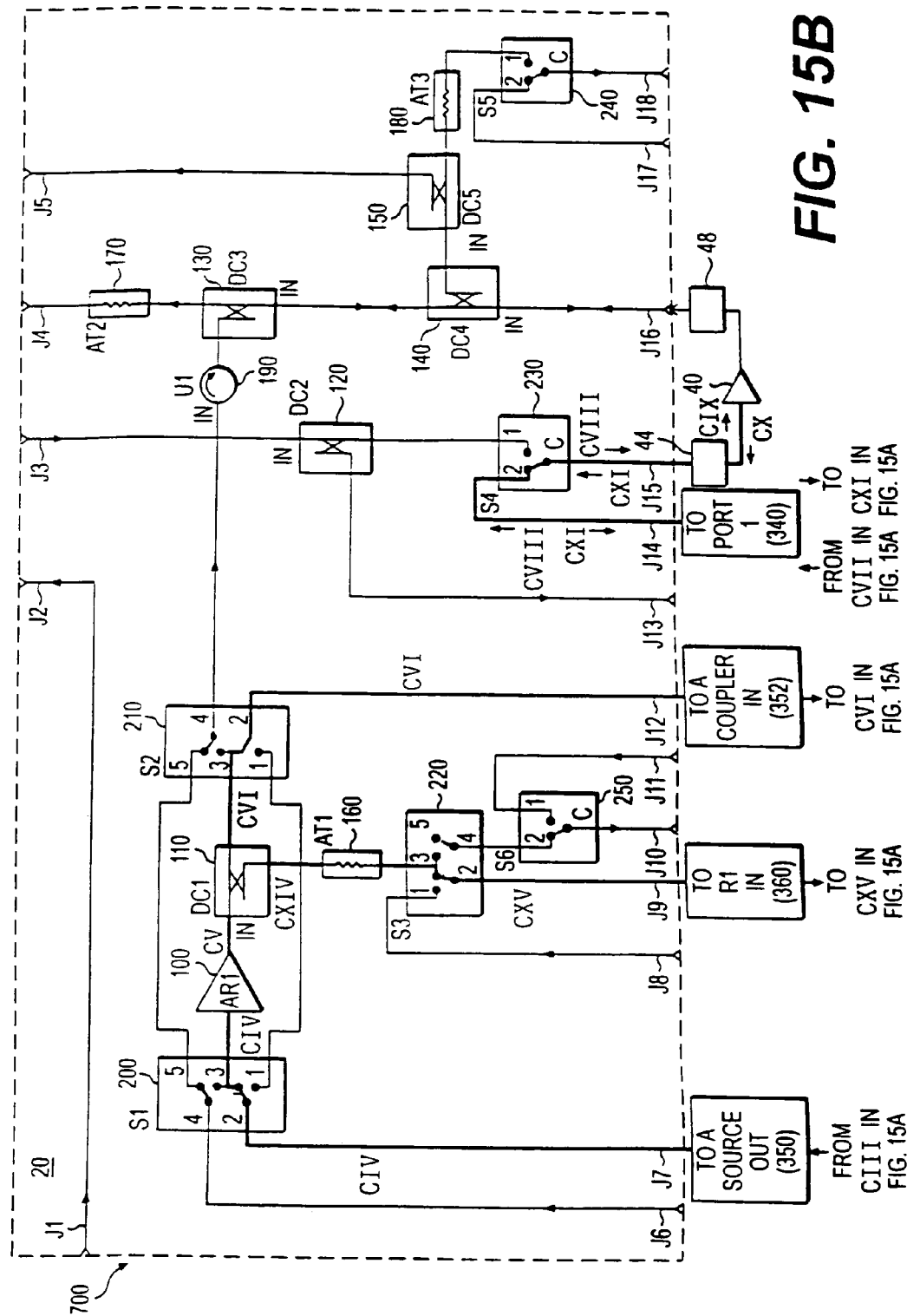
FIG. 15B is a schematic illustrating signal propagation through the precision system interface for hot S11 measurements.

FIGS. 15A and 15B are schematics illustrating signal propagation through VNA 30 and PSI 20 for hot S11 measurements. As shown in FIG. 15A, VNA source 300 generates a drive signal which enters switch splitter leveler 310 along path CI. The signal exits switch splitter leveler 310 along path CII and, in one embodiment, is attenuated by step attenuator 320. The attenuated signal travels along path CIII and exits VNA 30 at A Source Out 350.

The attenuated signal enters PSI 20 at port J7, as shown in FIG. 15B, and travels along path CIV passing through switch 200, with switch 200 in the 2-3 position. The signal enters the input of internal amplifier 100 and the amplified signal exits 100 along path CV. The amplified signal passes through the main-line input of directional coupler 110 along path CVI passing through switch 210, with switch 210 in the 3-2 position. The amplified signal continues to travel along path CVI and exits PSI 20 at port J12.

As shown in FIG. 15A, the amplified signal enters VNA 30 at A Coupler In 352 and travels along path CVII, exiting VNA 30 at Port 1 340. The amplified signal re-enters PSI 20, as shown in FIG. 15B, at port J14 and travels along path CVIII through switch 230, with switch 230 in the 2-C position. The amplified signal exits PSI 20 at port J15 and, passing through Test Port 1 44 along path CIX, enters the input of DUT 40. The amplified signal entering the input of DUT 40 drives DUT 40 to full operating power.

With continued reference to FIG. 15B, the hot S11 characterization signal of DUT 40 is reflected from the input of DUT 40 along path CX and, passing through Test Port 1 44, enters PSI 20 at port J15. The hot S11 signal passes through the C-2 path of switch 230, traveling along path CXI, and exits PSI 20 at port J14. The hot S11 signal enters VNA 30, as shown in FIG. 15A, at VNA Port 1 340 and travels along path CXII through the VNA internal directional coupler, exiting at the coupled port and passing thru jumper 380b. In one embodiment, the hot S11 signal is attenuated by step attenuator 322. The hot S11 signal then enters A Receiver 330 along path CXIII and is measured by A Receiver 330.

A phase-locked reference signal R1 is derived from the amplified drive signal passing through directional coupler 110 (FIG. 15B). The R1 reference signal is coupled off from the amplified drive signal by the coupled-line of directional coupler 110 along path CXIV. The R1 signal is attenuated by attenuator 160 before passing through switch 220, with switch 220 in the 3-2 position along path CXV. The R1 signal exits PSI 20 at port J9 and enters VNA 30 at R1 In 360 (FIG. 15A). The R1 signal travels along path CXVI and is measured by R1 Receiver 332. The final hot S11 measurement value is the ratio of the A Receiver 330 signal divided by the R1 Receiver 332 (reference) signal.

Figure 16A:
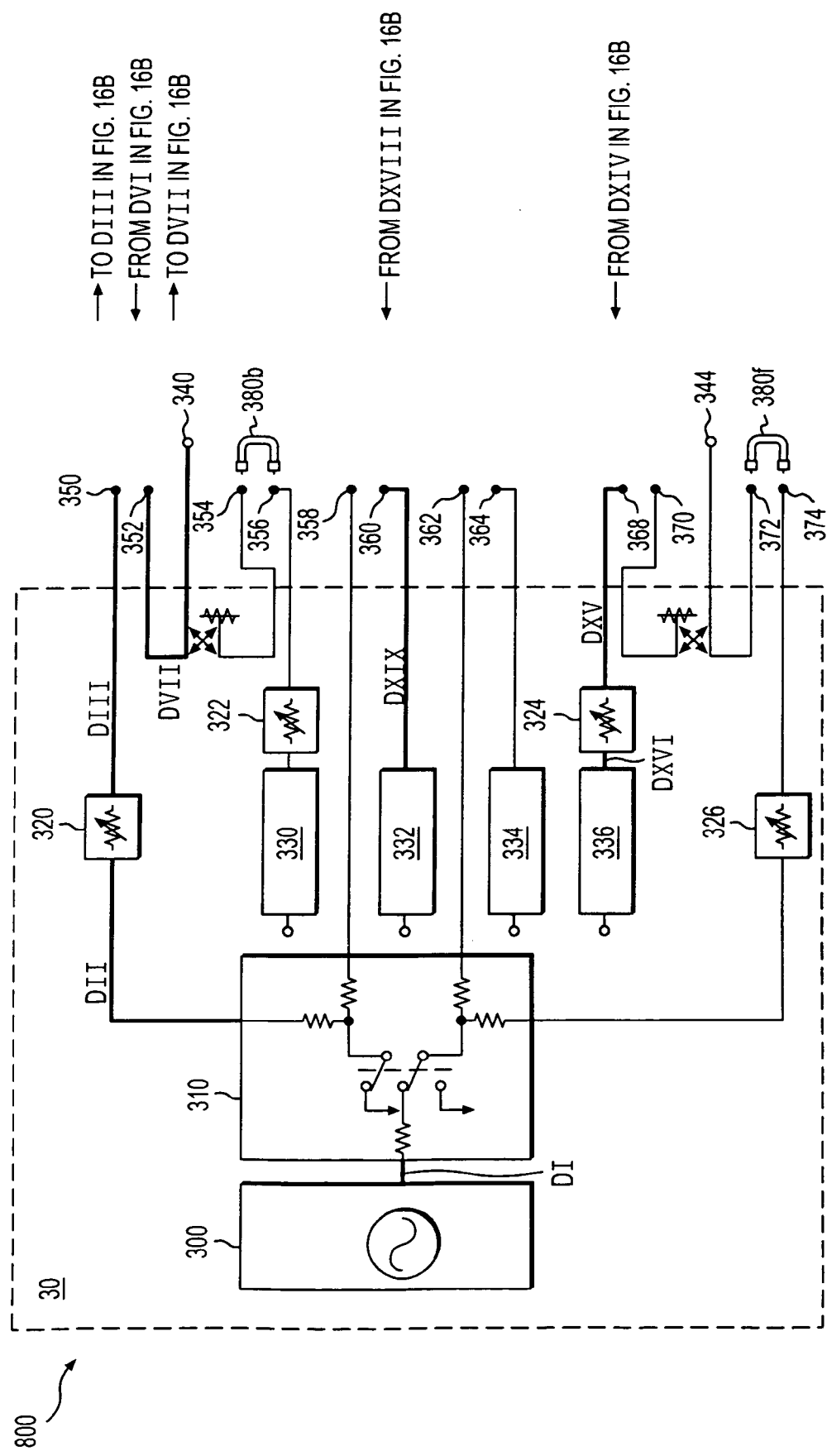
FIG. 16A is a schematic illustrating signal propagation through the vector network analyzer for hot S21 measurements.
Figure 16B:
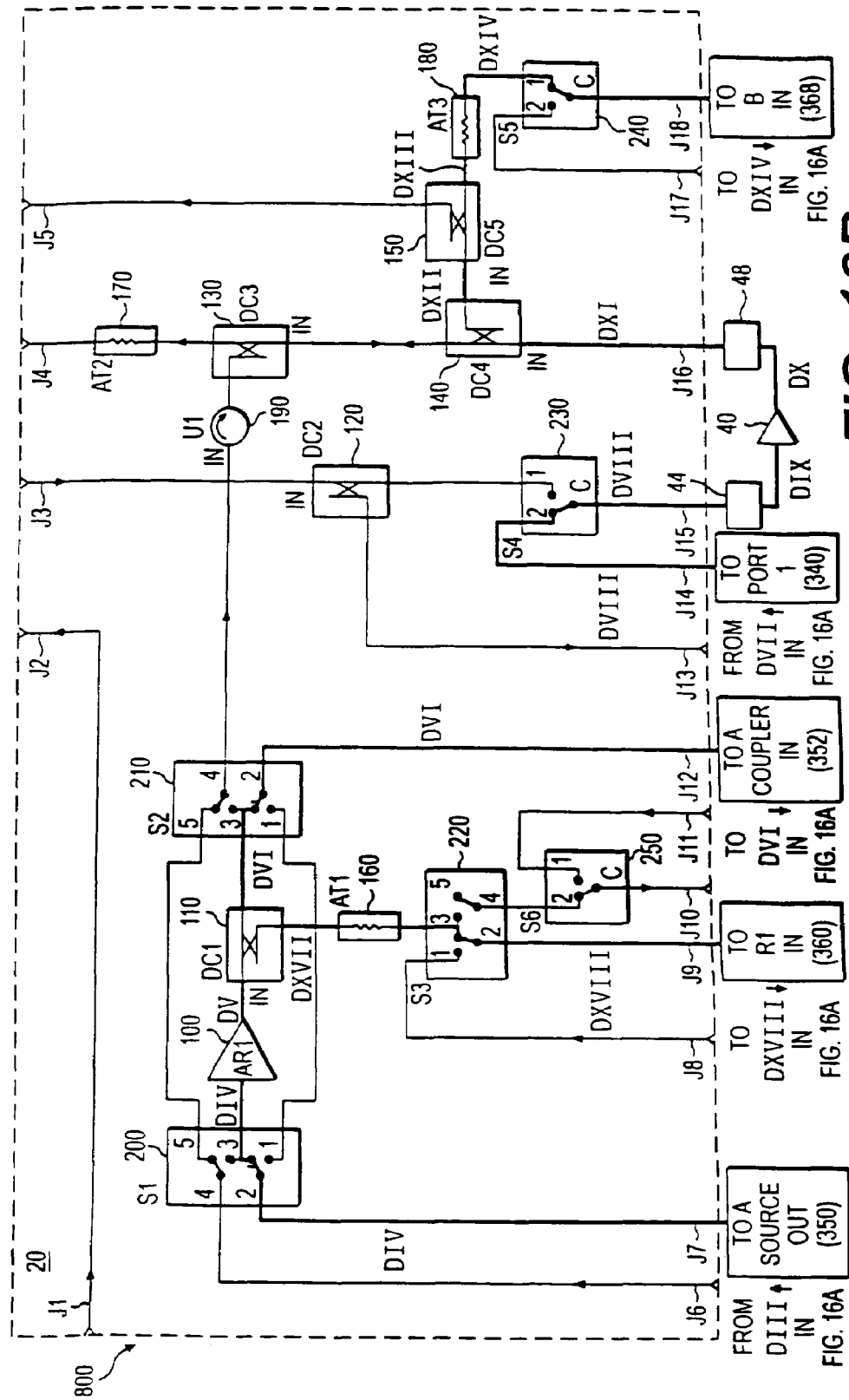
FIG. 16B is a schematic illustrating signal propagation through the precision system interface for hot S21 measurements.

FIGS. 16A and 16B are schematics illustrating signal propagation through VNA 30 and PSI 20 for hot S21 measurements. As shown in FIG. 16A VNA source 300 generates a drive signal, which enters switch splitter leveler 310 along path DI. The signal exits switch splitter leveler 310 along path DII. In one embodiment the signal is attenuated by step attenuator 320. The signal travels along path DIII and exits VNA 30 at A Source Out 350.

The signal enters PSI 20 at port J7, as shown in FIG. 16B, and travels along path DIV passing through switch 200, with switch 200 in the 2-3 position. The signal enters the input of internal amplifier 100 and the amplified signal exits 100 along path DV. The amplified signal passes through the main-line input of directional coupler 110 along path DVI passing through switch 210, with switch 210 in the 3-2 position. The amplified signal continues to travel along path DVI and exits PSI 20 at port J12.

As shown in FIG. 16A, the amplified signal enters VNA 30 at A Coupler In 352 and travels along path DVII, exiting VNA 30 at Port 1 340. The amplified signal re-enters PSI 20, as shown in FIG. 16B, at port J14 and travels along path DVIII through switch 230, with switch 230 in the 2-C position. The amplified signal exits PSI 20 at port J15 and, passing through Test Port 1 44 along path DIX, enters the input of DUT 40. The amplified signal entering the input of DUT 40 drives DUT 40 to full operating power.

The hot S21 parameter is generated from the output of DUT 40 along path DX and, passing through Test Port 2 48, enters PSI 20 at port J16. The hot S21 signal travels along path DXI and enters the main-line input of air-line directional coupler 140. The hot S21 signal is coupled off and exits the coupled-line output of air-line directional coupler 140 along path DXII. The coupled hot S21 signal passes through the input of directional coupler 150 along path DXIII. Attenuator 180 attenuates the hot S21 signal and the attenuated hot S21 signal travels through switch 240, with switch 240 in the I-C position, along path DXIV, exiting PSI 20 at port J18.

The attenuated hot S21 signal enters VNA 30, as shown in FIG. 16A, at B In 368 and travels along path DXV. In one embodiment, the attenuated hot S21 signal is further attenuated by step attenuator 324. The attenuated hot S21 signal travels along path DXVI and is measured by B receiver 336.

A phase-locked reference signal R1 is derived from the amplified drive signal passing through directional coupler 110 (FIG. 16B). The R1 reference signal is coupled off from the amplified drive signal by the coupled-line of directional coupler 110 along path DXVII. The R1 signal is attenuated by attenuator 160 before passing through switch 220 in the 3-2 position along path DXVIII. The R1 signal exits PSI 20 at port J9 and enters VNA 30 at R1 In 360 (FIG. 16A). The R1 signal travels along path DXIX and is measured by R1 Receiver 332. The final hot S21 measurement value is the ratio of the B Receiver 336 signal divided by the R1 Receiver 332 (reference) signal.

Figure 17A:
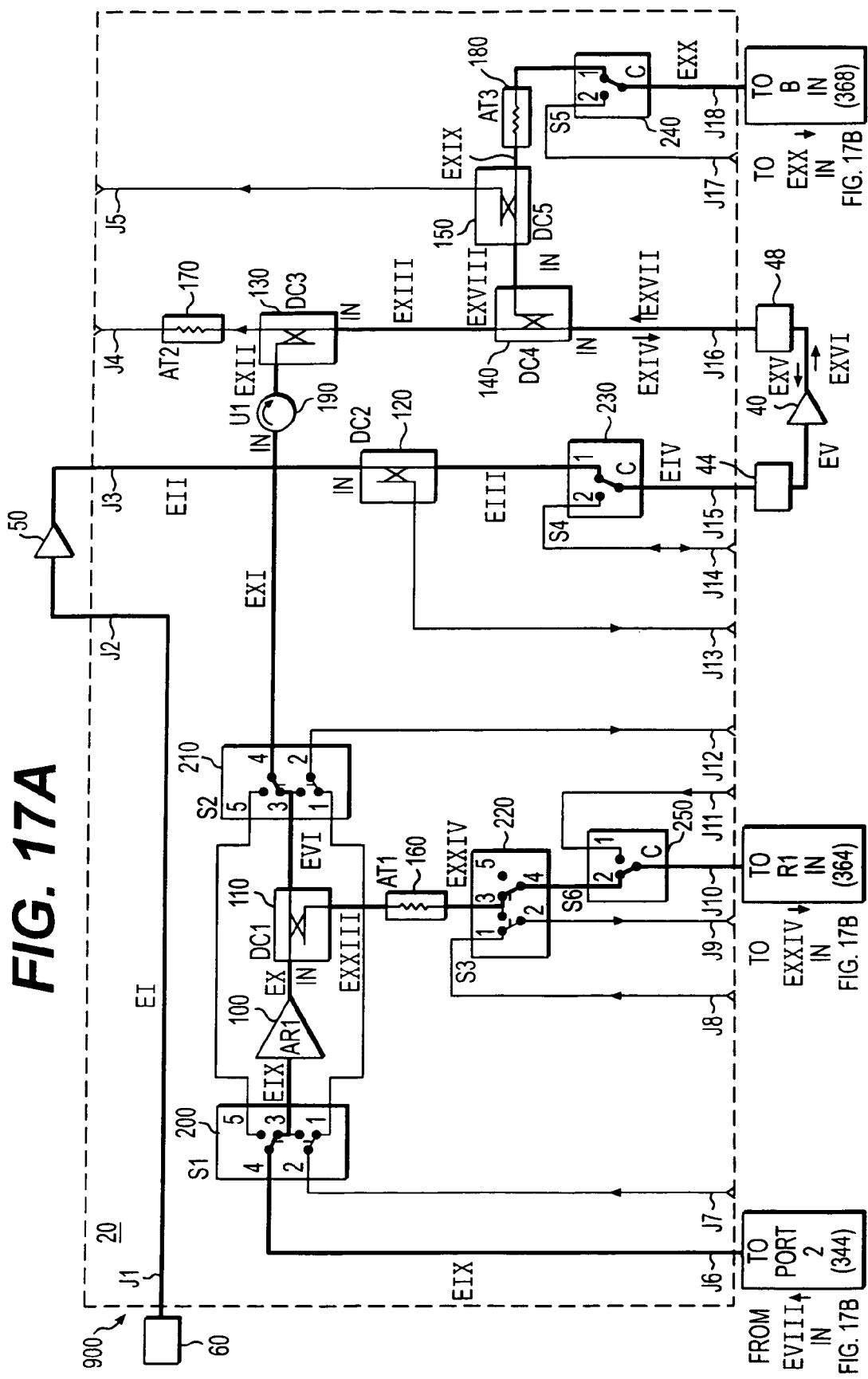
FIG. 17A is a schematic illustrating signal propagation through the precision system interface for hot S22 measurements.
Figure 17B:
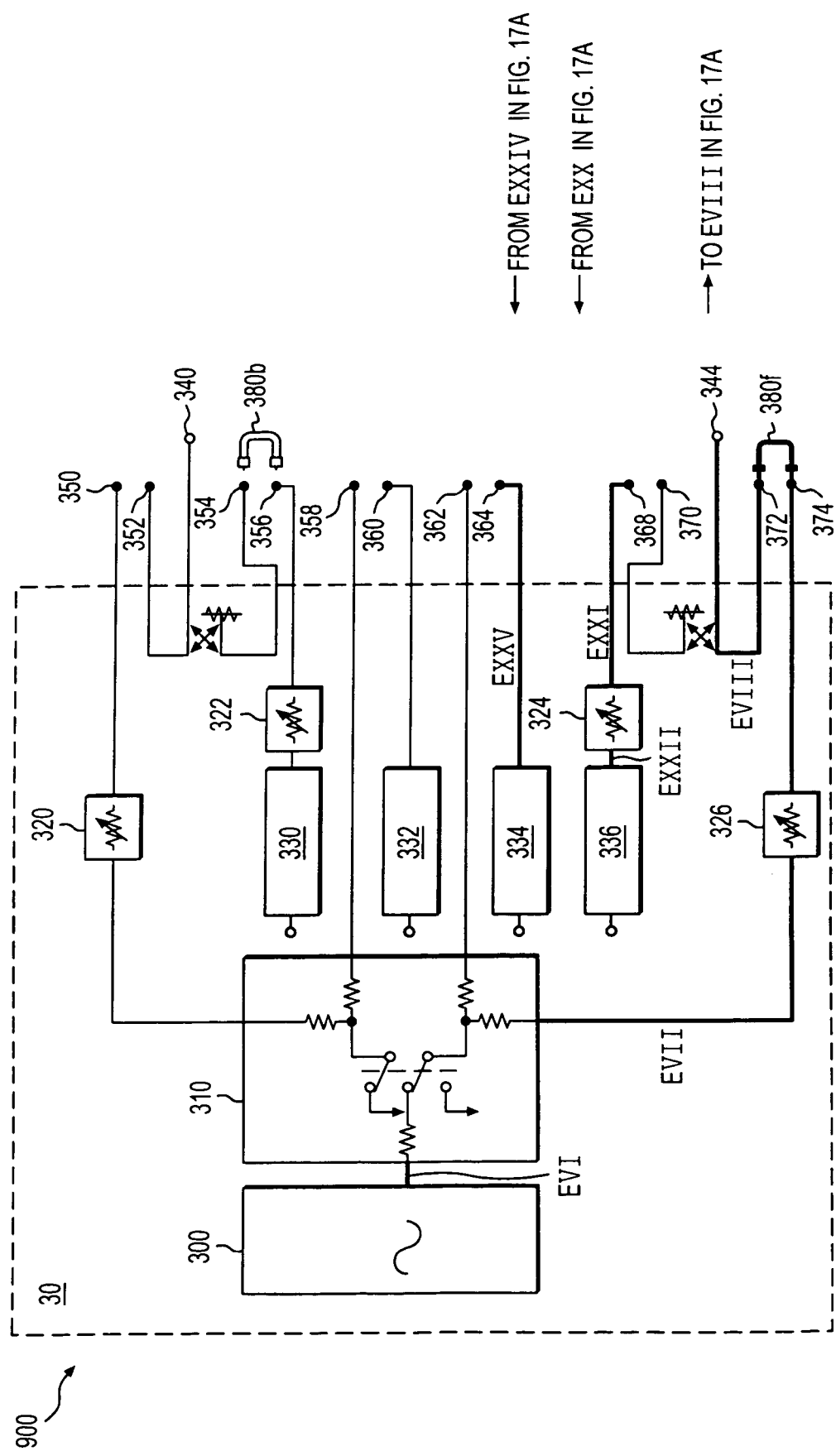
FIG. 17B is a schematic illustrating signal propagation through the vector network analyzer for hot S22 measurements.

FIGS. 17A and 17B are schematics illustrating signal propagation through PSI 20 and VNA 30 for hot S22 measurement. Signal generator 60 generates a drive signal at frequency F1 that enters PSI 20 at port J1, and traveling path EI, exits PSI 20 at port J2. External linear driver amplifier 50 amplifies the drive signal. The amplified drive signal enters PSI 20 at port J3 and passes through the main-line input of directional coupler 120 along path EII. The amplified drive signal exits the main-line output of directional coupler 120 along path EIII and passes through switch 230, with switch 230 in the 1-C position. The amplified drive signal exits PSI 20 along path EIV at port J15 and passing through Test Port 1 44 enters the input of DUT 40 along path EV. The amplified drive signal drives DUT 40 to full operating power.

VNA Source 300, as shown in FIG. 17B, generates an output injection signal at frequency F2 which enters switch splitter leveler 310 along path EVI. Frequency F1 of the drive signal is slightly different from frequency F2 of the output injection signal. Because the drive signal drives the DUT 40 to full operating power at frequency Fl, if the same frequency were injected into the output of DUT 40, the reflected signal would be swamped. For example, if the DUT 40 is outputting 100 watts and the output injection signal is one watt, then the output injection signal would be overwhelmed by the 100 watt output of the DUT 40. Therefore, if the drive signal Fl is, for example, 2000 MHz, the output injection signal is 2005 MHz.

With reference to FIG. 17B, the output injection signal exits switch splitter leveler 310 along path EVII. In one embodiment the output injection signal is attenuated by step attenuator 326. The output injection signal travels along path EVIII and exits VNA 30 at VNA Port 2 344. The output injection signal enters PSI 20, as shown in FIG. 17A, at port J6. The output injection signal travels along path EIX through switch 200, with switch 200 in the 4-3 position. The output injection signal is amplified by the internal amplifier 100. The amplified output injection signal travels along path EX and passes through the main-line of directional coupler 110. The amplified output injection signal exits directional coupler 110 at the main-line output and passes through switch 210, with switch 210 in the 3-4 position. The amplified output injection signal travels along path EXI to the wide-band isolator 190. The wide-band isolator U1 allows in-band signals (for example, from 0.8 to 2.2 GHz) to pass, and prevents signals flowing in the other direction (from the output of DUT 40) from passing.

The amplified output injection signal enters air-line directional coupler 130 at the coupled-line port along path EXII and exits the main-line input of air-line directional coupler 130. (As discussed previously, when a signal is input at the coupled-line of a directional coupler an attenuated version of the signal appears at the main-line input of the directional coupler. However, no signal will appear at the output of the directional coupler.) The amplified signal travels along path EXIII and passes through the main-line of air-line directional coupler 140. The amplified signal exits the main-line of air-line directional coupler 140 unattenuated and exits PSI 20 at port J1 6 along path EXIV. The amplified output injection signal passes through Test Port 2 48 along path EXV and is injected into the output of DUT 40.

The hot S22 parameter reflects from the output of DUT 40 along path EXVI and, passing through Test Port 2 48, enters PSI 20 at port J16. The hot S22 signal travels along path EXVII and enters the main-line input of 140. The hot S22 signal is coupled off and exits air-line directional coupler 140 at the coupled-line output along path EXVIII. The coupled hot S22 signal passes through the main-line of directional coupler 150 along path EXIX. Attenuator 180 attenuates the hot S22 signal and the attenuated hot S22 signal travels through switch 240, with 240 in the 1-C position, along path EXX, exiting PSI 20 at port J18. The attenuated hot S22 signal enters VNA 30, as shown in FIG. 17B, at B In 368 and travels along path EXXI. In one embodiment, the attenuated hot S22 signal is further attenuated by step attenuator 324. The hot S22 signal travels along path EXXII and is measured by B receiver 336.

A phase-locked reference signal R2 is derived from the amplified drive signal passing through directional coupler 110 (FIG. 17A). The R2 reference signal is coupled off from the amplified drive signal by the coupled-line of directional coupler 110 along path EXXIII. The R2 signal is attenuated by attenuator 160 before passing through switch 220, with switch 220 in the 3-4 position, and then through switch 250, with switch 250 in the 2-C position, along path EXXIV. The R2 signal exits PSI 20 at port J10 and enters VNA 30 at R2 In 364 (FIG. 17B). The R2 signal travels along path EXXV and is measured by R2 Receiver 334. The final hot S22 measurement value is the ratio of the B Receiver 336 signal divided by the R2 Receiver 334 (reference) signal.

Figure 18A:
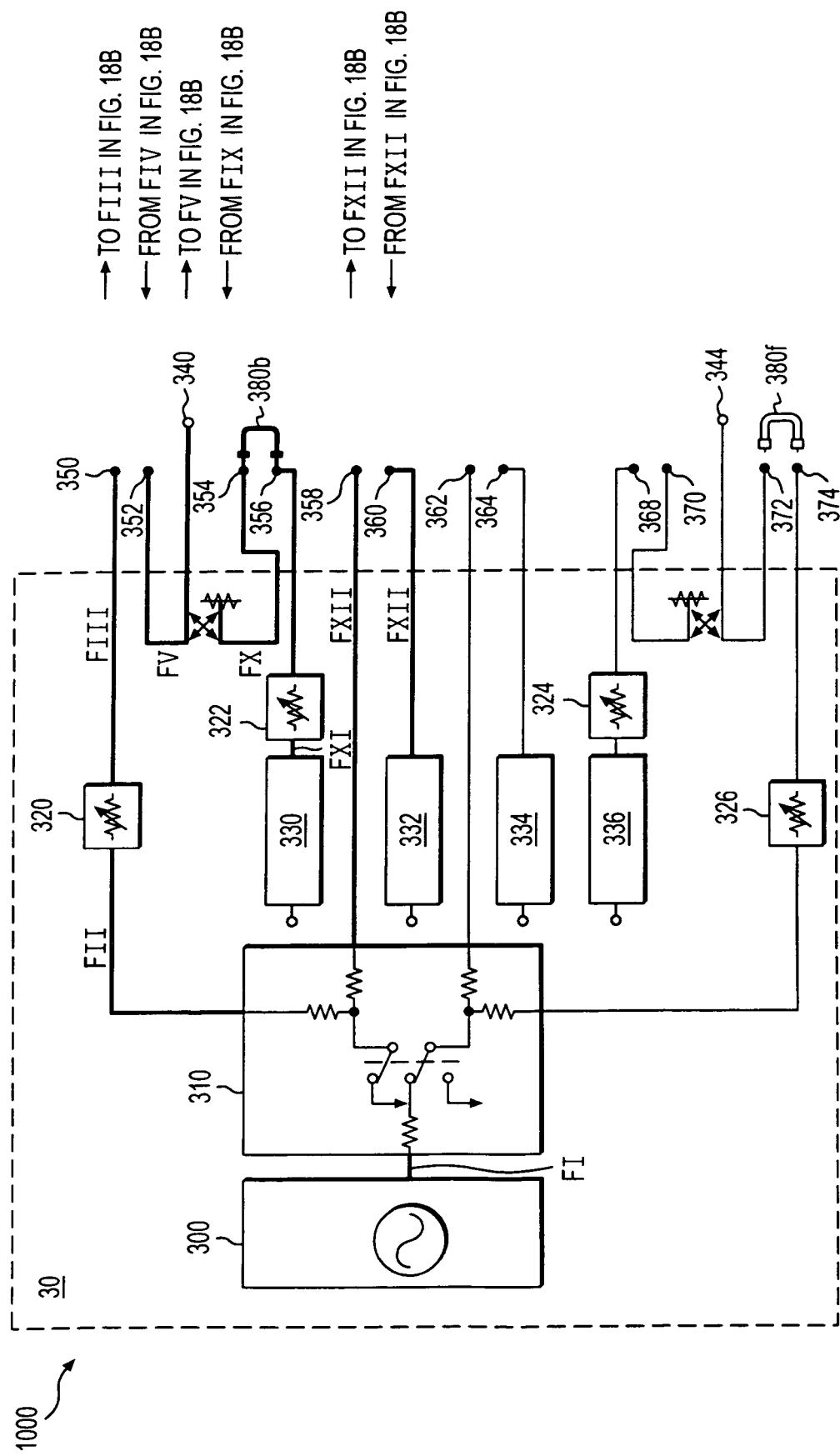
FIG. 18A is a schematic illustrating signal propagation through the vector network analyzer for small-signal s11 measurements.
Figure 18B:
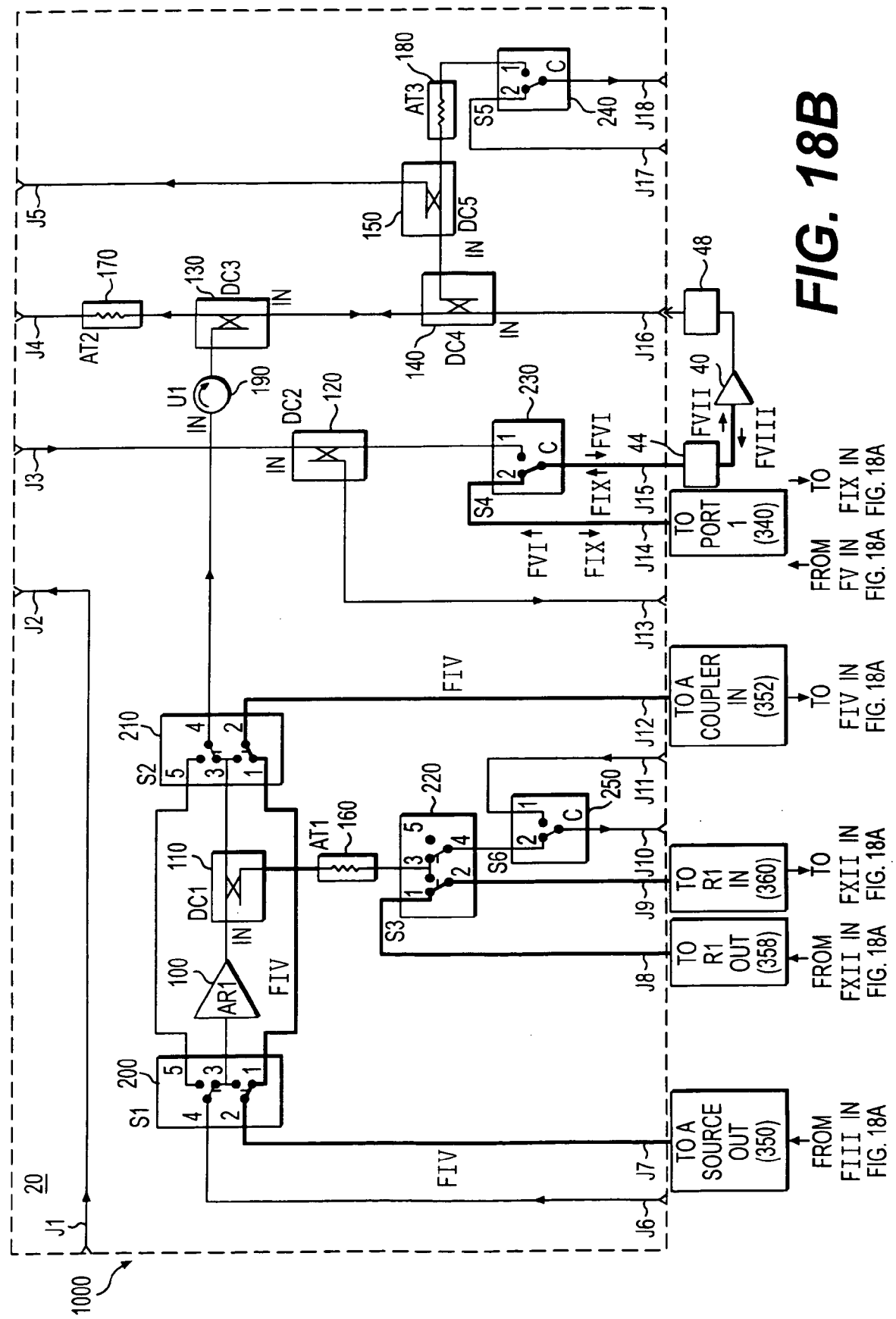
FIG. 18B is a schematic illustrating signal propagation through the precision system interface for small-signal s11 measurements.

FIGS. 18A and 18B are schematics illustrating signal propagation through VNA 30 and PSI 20 for small-signal s11 measurements. As shown in FIG. 18A, VNA source 300 generates a signal which enters switch splitter leveler 310 along path Fl. The signal exits switch splitter leveler 310 along path FII. In one embodiment, the signal is attenuated by step attenuator 320. The signal travels along path FIII and exits VNA 30 at A Source Out 350.

The signal enters PSI 20 at port J7, as shown in FIG. 18B, and travels along path FIV passing through switch 200, with switch 200 in the 2-1 position. The signal bypasses internal amplifier 100 since an amplified drive signal is not required to drive DUT 40 to full operating power for small-signal characterization measurements. The signal passes through switch 210, with switch 210 in the 1-2 position, and continues to travel along path FIV, exiting PSI 20 at port J12. As shown in FIG. 18A, the signal enters VNA 30 at A Coupler In 352 and travels along path FV, exiting VNA 30 at Port 1 340. The signal enters PSI 20, as shown in FIG. 18B, at port J14 and travels along path FVI through switch 230, with switch 230 in the 2-C position. The signal exits PSI 20 at port J15 and, passing through Test Port 1 44 along path FVII, enters the input of DUT 40.

The small-signal s11 characterization signal of DUT 40 is reflected from the input of DUT 40 along path FVIII and, passing through Test Port 1 44, enters PSI 20 at port J15. The s11 signal passes through switch 230 along the C-2 path, traveling along path FIX, and exits PSI 20 at port J14. The s11 signal enters VNA 30, as shown in FIG. 18A, at VNA Port 1 340 and travels along path FX. In one embodiment, the s11 signal is attenuated by step attenuator 322. The s11 signal then travels through the VNA internal directional coupler, exiting at the coupled port, then through jumper 380b. The s11 signal then enters A Receiver 330 along path FXI and is measured by A Receiver 330.

A phase-locked reference signal R1 is derived from the signal passing from the switch splitter leveler 310 along path FXII, exiting the VNA 30 at R1 Out 358 (FIG. 18A), and entering the PSI 20 at J8 (FIG. 18B). The R1 reference signal passes through switch 220 in the 1-2 position along path FXII. The R1 signal exits PSI 20 at port J9 and enters VNA 30 at R1 In 360 (FIG. 18A). The R1 signal travels along path FXII and is measured by R1 Receiver 332. The small signal S11 measurement value is the ratio of the A Receiver 336 signal divided by the R1 Receiver 332 (reference) signal.

Figure 19A:
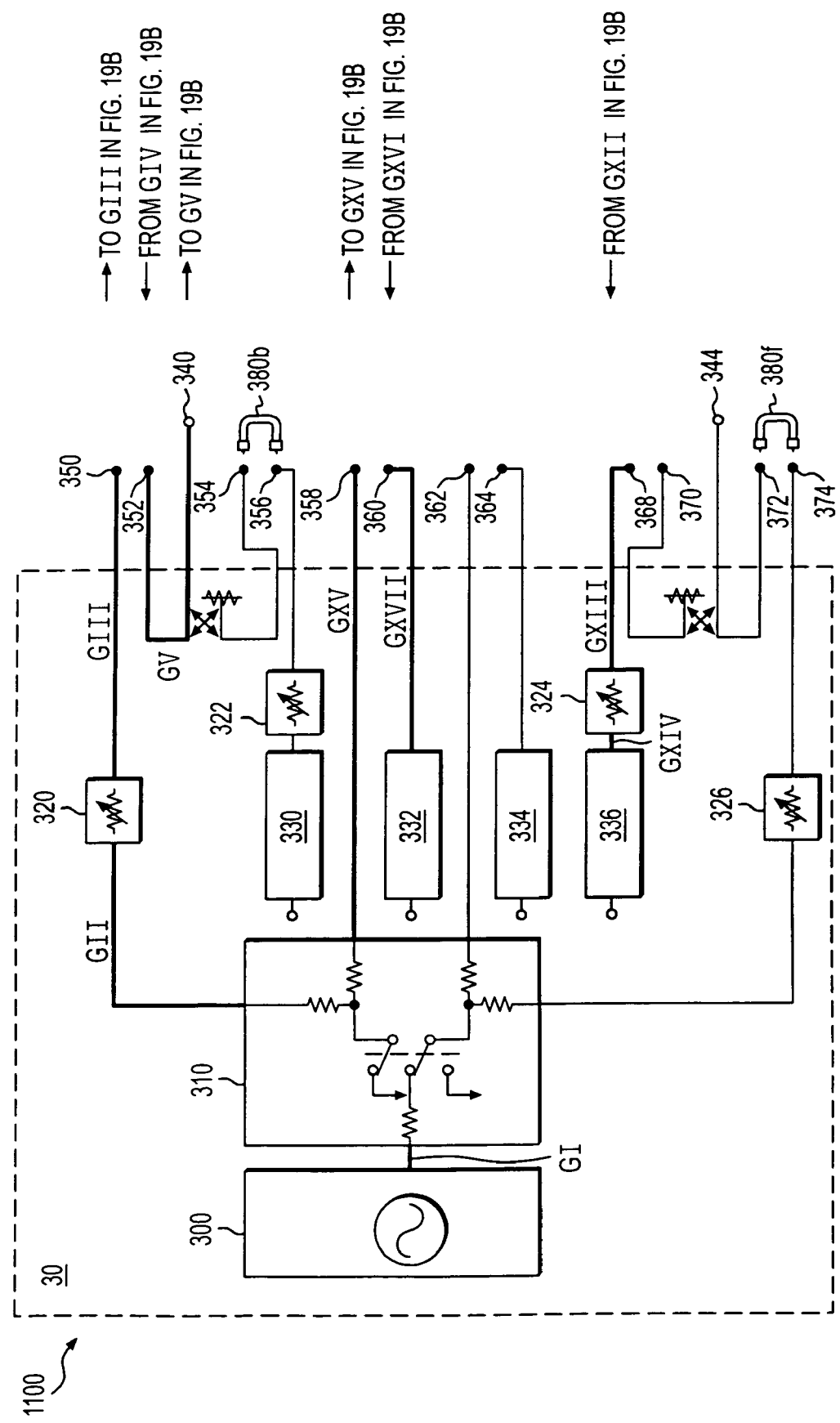
FIG. 19A is a schematic illustrating signal propagation through the vector network analyzer for small-signal s21 measurements.
Figure 19B:
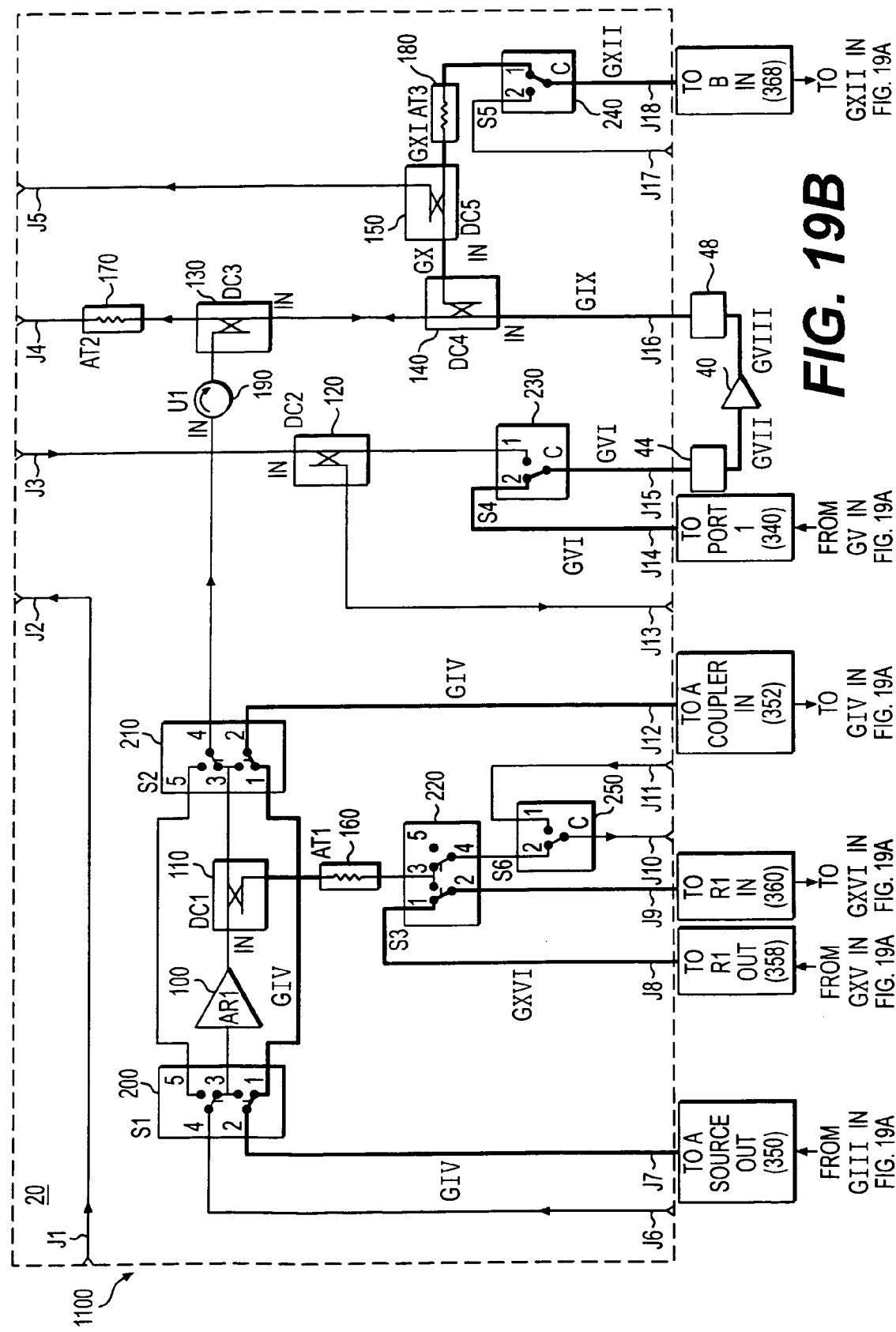
FIG. 19B is a schematic illustrating signal propagation through the precision system interface for small-signal s21 measurements.

FIGS. 19A and 19B are schematics illustrating signal propagation through VNA 30 and PSI 20 for small-signal s21 measurements. As shown in FIG. 19A VNA source 300 generates a signal, which enters switch splitter leveler 310 along path GI. The signal exits switch splitter leveler 310 along path GII. In one embodiment, the signal is attenuated by step attenuator 320. The signal travels along path GIII and exits VNA 30 at A Source Out 350.

The signal enters PSI 20 at port J7, as shown in FIG. 19B, and travels along path GIV passing through switch 200, with switch 200 in the 2-1 position. The signal bypasses internal amplifier 100 since an amplified signal is not required to drive DUT 40 to full operating power for small-signal characterization measurements. The signal passes through switch 210, with switch 210 in the 1-2 position, and continues to travel along path GIV, exiting PSI 20 at port J12.

As shown in FIG. 19A, the signal enters VNA 30 at A Coupler In 352 and travels along path GV, exiting VNA 30 at Port 1 340. The signal enters PSI 20, as shown in FIG. 19B, at port J14 and travels along path GVI through switch 230, with switch 230 in the 2-C position. The signal exits PSI 20 at port J15 and, passing through Test Port 1 44 along path GVII, enters the input of DUT 40.

With reference to FIG. 19B, the small-signal s21 parameter is generated from the output of DUT 40 along path GVIII and, passing through Test Port 2 48, enters PSI 20 at port J16. The s21 signal travels along path GIX and enters the main-line input of air-line directional coupler 140. The s21 signal is coupled off and exits at the coupled-line output of air-line directional coupler 140 along path GX. The coupled s21 signal passes through the input of directional coupler 150 along path GXI. Attenuator 180 attenuates the s21 signal and the attenuated s21 signal travels through switch 240, with switch 240 in the 1-C position, along path GXII, exiting PSI 20 at port J18. The attenuated s21 signal enters VNA 30, as shown in FIG. 19A, at B In 368 and travels along path GXIII. In one embodiment, the attenuated s21 signal is further attenuated by step attenuator 324. The attenuated s21 signal travels along path GXIV and is measured by B receiver 336.

A phase-locked reference signal R1 is derived from the signal passing from the switch splitter leveler 310 along path GXV, exiting the VNA 30 at R1 Out 358 (FIG. 19A), and entering the PSI 20 at J8 (FIG. 19B). The R1 reference signal passes through switch 220 in the 1-2 position along path GXVI. The R1 signal exits PSI 20 at port J9 and enters VNA 30 at R1 In 360 (FIG. 19A). The R1 signal travels along path GXVII and is measured by R1 Receiver 332. The small signal S21 measurement value is the ratio of the B Receiver 336 signal divided by the R1 Receiver 332 (reference) signal.

Figure 20A:
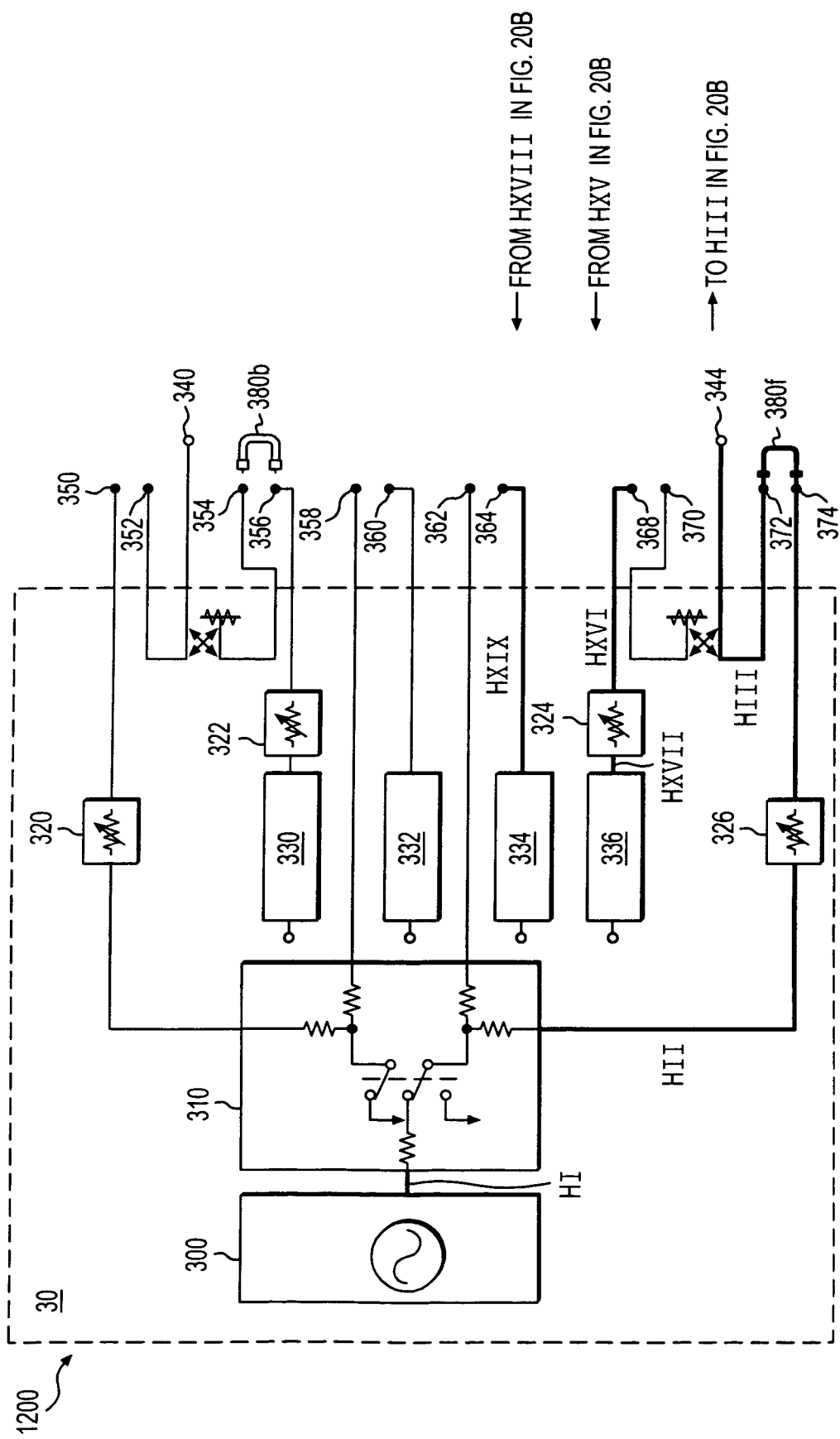
FIG. 20A is a schematic illustrating signal propagation through the vector network analyzer for small-signal s22 measurements.
Figure 20B:
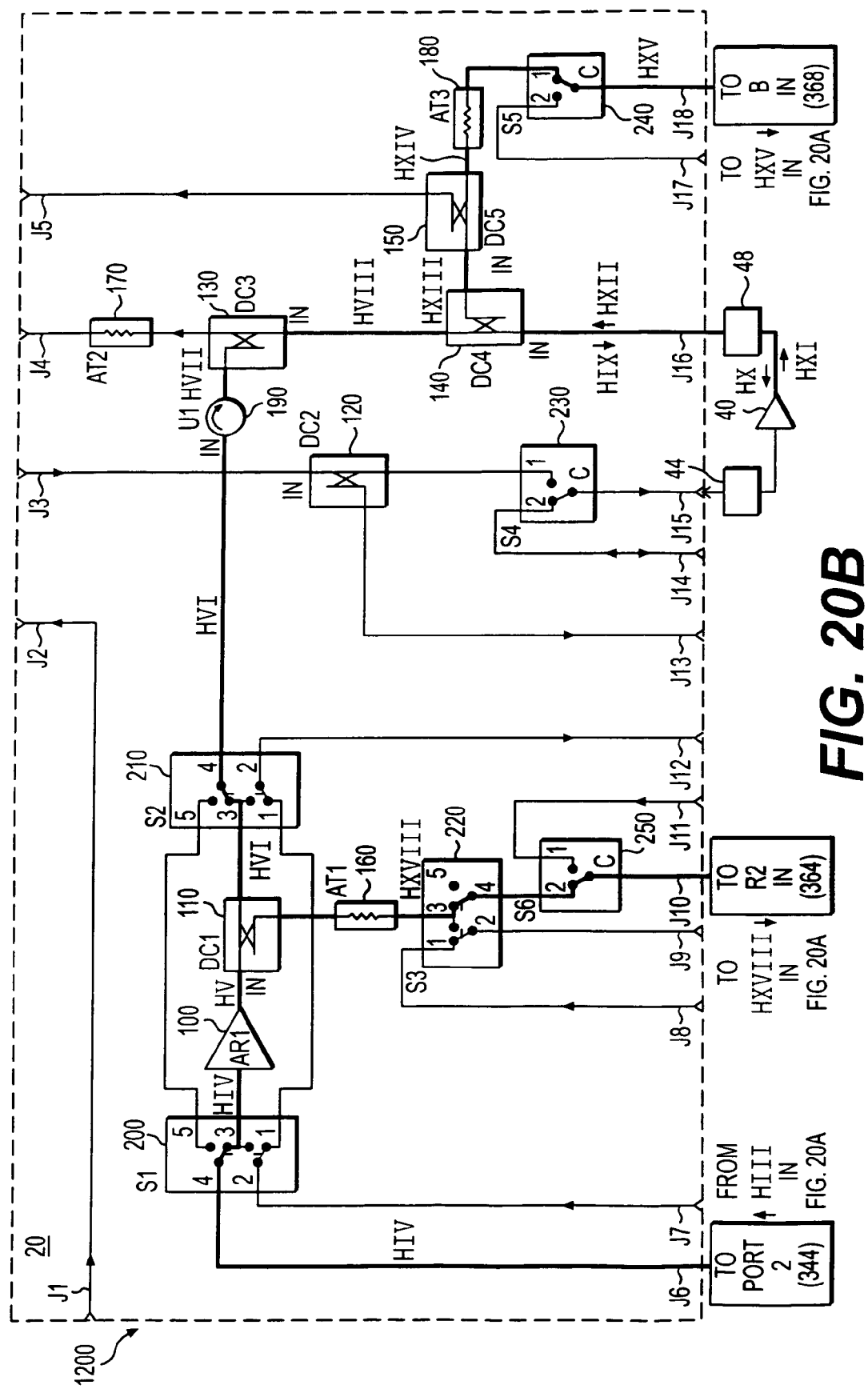
FIG. 20B is a schematic illustrating signal propagation through the precision system interface for small-signal s22 measurements.

FIGS. 20A and 20B are schematics illustrating signal propagation through PSI 20 and VNA 30 for small-signal s22 measurement. VNA Source 300, as shown in FIG. 20A, generates an output injection signal which enters switch splitter leveler 310 along path HI. The output injection signal exits switch splitter leveler 310 along path HII. In one embodiment, the signal is attenuated by step attenuator 326. The output injection signal travels along path HIII and exits VNA 30 at VNA Port 2 344. The output injection signal enters PSI 20, as shown in FIG. 20B, at port J6. The output injection signal travels along path HIV through switch 200, with switch 200 in the 4-3 position. The output injection signal is amplified by 100 as for hot S22 measurements to provide a high level signal to the DUT 40 output. Even though an amplified output injection signal is not required for some small-signal s22 measurements, the reflected signal from an extremely good small-signal device can be too low to measure accurately, so the amplifier is usually needed.

With reference to FIG. 20B, the amplified output injection signal travels along path HV and passes through the main-line of directional coupler 110. The amplified output injection signal exits at the main-line output of directional coupler 110 and passes through switch 210, with switch 210 in the 3-4 position. The amplified output injection signal travels along path HVI to the wide-band isolator 190. The wide-band isolator 190 allows in-band signals (for example, from 0.8 to 2.2 GHz) to pass. The amplified output injection signal enters air-line directional coupler 130 at the coupled-line port along path HVII and exits the main-line input of air-line directional coupler 130. (When a signal is input at the coupled-line of a directional coupler an attenuated version of the signal appears at the main-line input. However, no signal will appear at the output of the directional coupler.) The amplified signal travels along path HVIII and passes through the main-line of air-line directional coupler 140. The amplified signal exits the main-line of air-line directional coupler 140 unattenuated and exits PSI 20 at port J16 along path HIX. The amplified output injection signal passes through Test Port 2 48 along path HX and is injected into the output of DUT 40.

The small-signal s22 parameter is reflected from the output of DUT 40 along path HXI and, passing through Test Port 2 48, enters PSI 20 at port J16. The s22 signal travels along path HXII and enters the main-line input of air-line directional coupler 140. The s22 signal is coupled off and exits at the coupled-line output of air-line directional coupler 140 along path HXIII. The coupled s22 signal passes through the main-line of directional coupler 150 along path HXIV. Attenuator 180 attenuates the s22 signal and the attenuated s22 signal travels through switch 240, with switch 240 in the 1-C position, along path HXV, exiting PSI 20 at port J18. The attenuated s22 signal enters VNA 30, as shown in FIG. 20A, at B In 368 and travels along path HXVI. In one embodiment, the attenuated s22 signal is further attenuated by step attenuator 324. The attenuated s22 signal travels along path HXVII and is measured by B receiver 336.

A phase-locked reference signal R2 is derived from the amplified drive signal passing through directional coupler 110 (FIG. 20B). The R2 reference signal is coupled off from the amplified drive signal by the coupled-line of directional coupler 110 along path HXVIII. The R2 signal is attenuated by attenuator 160 before passing through switch 220, with switch 220 in the 3-4 position, and then through switch 250, with switch 250 in the 2-C position. The R2 signal exits PSI 20 at port J10 and enters VNA 30 at R2 In 364 (FIG. 20B). The R2 signal travels along path HXIX and is measured by R2 Receiver 334. The small signal S22 measurement value is the ratio of the B Receiver 336 signal divided by the R2 Receiver 334 (reference) signal.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A method for measuring power amplification functions, comprising a first mode that includes:
providing a first signal at a predetermined first frequency (F1) to an input of a device under test, wherein the first signal is provided by a measurement interface apparatus;
receiving a harmonics signal at the measurement interface apparatus from an output of the device under test;
passing the harmonics signal through an input port of a main-line of a first air-line directional coupler disposed within the measurement interface apparatus; and
providing the harmonics signal from an output port of the main-line of the first air-line directional coupler to a spectrum analyzer coupled to the measurement interface apparatus.

2. The method of claim 1, further comprising:
providing an initial signal at the predetermined first frequency to an input of a first amplifier, wherein the initial signal is generated by a signal generator coupled to the measurement interface apparatus;
receiving an amplified version of the initial signal from an output of the first amplifier, wherein the first signal provided to the input of the device under test is the amplified version of the initial signal.

3. The method of claim 2, wherein the first signal drives the device under test to full power output, further comprising a second mode that includes:
providing a second signal at a predetermined second frequency (F2) to an input of a second amplifier disposed within the measurement interface apparatus to provide an amplified second signal, wherein the second signal is generated by a network analyzer coupled to the measurement interface apparatus;
passing the amplified second signal through an input port of a directional coupler disposed within the measurement interface apparatus;
providing the amplified second signal from an output port of the directional coupler to a wide band isolator disposed within the measurement interface apparatus to provide an isolated second signal;
passing the isolated second signal through a coupled-line of the first airline directional coupler to the main-line of the first air-line directional coupler to provide a coupled second signal;
providing the coupled second signal to the output of the device under test, wherein the device under test reflects a portion of the coupled second signal as a reflected signal (S22);
passing the reflected signal through an input port of a main-line of a second air-line directional coupler to a coupled-line of the second air-line directional coupler disposed within the measurement interface apparatus to provide a coupled reflected signal; and
providing the coupled reflected signal to a first receiver disposed within a network analyzer coupled to the measurement interface apparatus.

4. The method of claim 3, further comprising:
providing the amplified second signal from a coupled output port of the directional coupler to produce a reference signal (R2); and
providing the reference signal to a second receiver disposed within the network analyzer.

5. The method of claim 1, further comprising a second mode that includes:
providing a second signal at a predetermined second frequency (F2) to an input of a second amplifier disposed within the measurement interface apparatus to provide an amplified second signal, wherein the second signal is generated by a network analyzer coupled to the measurement interface apparatus;
passing the amplified second signal through an input port of a directional coupler disposed within the measurement interface apparatus; and
providing the amplified second signal from an output port of the directional coupler to the input of the device under test, wherein the amplified second signal drives the device under test to full power output.

6. The method of claim 5, further comprising:
receiving a reflected signal (S 11) at the measurement interface apparatus from the input of the device under test; and
providing the reflected signal to a receiver disposed within the network analyzer.

7. The method of claim 5, further comprising a third mode that includes:
receiving a generated signal (S21) at the measurement interface apparatus from the output of the device under test;
passing the generated signal through an input port of a main-line of a second air-line directional coupler disposed within the measurement interface apparatus to produce a coupled generated signal; and providing the coupled generated signal to a receiver disposed within the network analyzer.

8. The method of claim 7, further comprising:

providing the coupled generated signal from an output port of a coupled-line of the second air-line directional coupler to an attenuator to produce an attenuated generated signal, wherein the coupled generated signal provided to the receiver disposed within the network analyzer is attenuated.

9. The method of claim 5, further comprising:

providing the amplified second signal from a coupled output port of the directional coupler to produce a reference signal (R1); and providing the reference signal (RI) to a receiver disposed within the network analyzer.

10. The method of claim 1, further comprising a fifth mode that includes:

blocking the first signal such that it does not enter the input of the device under test;

providing a second signal (FS 1) to the input of the device under test, wherein the second signal is generated by a network analyzer coupled to the measurement interface apparatus and the second signal is provided by the measurement interface apparatus;

receiving a reflected signal (s11) at the measurement interface apparatus from the input of the device under test; and providing the reflected signal to a receiver disposed within the network analyzer.

11. The method of claim 1, further comprising a second mode that includes:

blocking the first signal such that it does not enter the input of the device under test;

providing a second signal (FS 1) to the input of the device under test, wherein the second signal is generated by a network analyzer coupled to the measurement interface apparatus and the second signal is provided by the measurement interface apparatus;

receiving a generated signal (s21) at the measurement interface apparatus from the output of the device under test; and providing the generated signal to a receiver disposed within the network analyzer.

12. The method of claim 1, further comprising a second mode that includes:

blocking the first signal such that it does not enter the input of the device under test;

providing a second signal at a predetermined second frequency (F2) to an input of a amplifier disposed within the measurement interface apparatus to provide an amplified second signal, wherein the second signal is generated by a network analyzer coupled to the measurement interface apparatus;

providing the amplified second signal from an output port of a directional coupler to a wide band isolator disposed within the measurement interface apparatus to provide an isolated second signal;

passing the isolated second signal through a coupled-line of the first air-line directional coupler to the main-line of the first air-line directional coupler disposed within the measurement interface apparatus to provide a coupled second signal;

providing the coupled second signal to the output of the device under test, wherein the device under test reflects a portion of the coupled signal as a reflected signal (s22);

passing the reflected signal through an input port of a main-line of a second air-line directional coupler disposed within the measurement interface apparatus to a coupled-line of the second air-line directional coupler to provide a coupled reflected signal;

providing the coupled reflected signal to a receiver disposed within the network analyzer.

13. The method of claim 12, further comprising:

providing the amplified second signal from a coupled output port of the first air-line directional coupler to produce a reference signal (R2); and providing the reference signal to a second receiver disposed within the network analyzer.

* * * * *